United States Patent [19]
Iijima et al.

[11] Patent Number: 5,650,378
[45] Date of Patent: Jul. 22, 1997

[54] METHOD OF MAKING POLYCRYSTALLINE THIN FILM AND SUPERCONDUCTING OXIDE BODY

[75] Inventors: Yasuhiro Iijima; Nobuo Tanabe, both of Tokyo, Japan

[73] Assignee: Fujikura Ltd., Tokyo, Japan

[21] Appl. No.: 510,772

[22] Filed: Aug. 3, 1995

Related U.S. Application Data

[62] Division of Ser. No. 155,647, Nov. 22, 1993, abandoned, which is a continuation of Ser. No. 956,077, Oct. 2, 1992, abandoned.

[51] Int. Cl.$^6$ ................................. B05D 5/12; B05D 3/06
[52] U.S. Cl. ......................... 505/473; 505/474; 505/475; 505/434; 505/238; 505/731; 505/732; 204/192.11; 204/192.22; 204/192.24; 204/298.04; 427/62; 427/596; 427/126.3; 427/255.7; 427/419.3
[58] Field of Search ........................... 505/473, 474, 505/475, 434, 238, 731, 732; 204/192.11, 192.22, 192.24, 298.04; 427/62, 596, 126.3, 255.7, 419.3

[56] References Cited

FOREIGN PATENT DOCUMENTS

| 0 447 767 | 9/1991 | European Pat. Off. . |
| 2-54757 | 2/1990 | Japan . |

OTHER PUBLICATIONS

INSPEC, Institute of Electrical Engineers, AN-439847, O. Kohno, et al., "Improvement of Jc-B Characteristics Biaxially Aligned Y-Ba-Cu-O Thin Films On Metallic Substrate".

Iijima et al, "Biaxially Aligned YSZ buffer layer on polycrystallline substrates", 4th International Symposium On Superconductivity (ISS '91) Oct. 14–17, 1991, Tokyo, Japan.

Iijima et al, Appl. Phys. Lett. 60(6), Feb. 1992, pp. 769–771.

Schmidt et al, Appl. Phys. Lett. 59(2) Jul. 1991, pp. 222–224.

Yu et al, J. Vac. Sci. Technol, A4(3), May/Jun. 1986, pp. 443–447.

Iijima et al, "Biaxially Aligned $YBa_2Cu_3O_{7-x}$ Thin Film Tape", Proceedings of the International Conference on Materials and Mechanisms of Superconductivity High Temperature Superconductors III, Kanazawa, Japan, Jul. 22–26, 1991, pp. 1959–1960.

*Primary Examiner*—Roy V. King
*Attorney, Agent, or Firm*—Oblon, Spivak, McClelland, Maier & Neustadt, P.C.

[57] ABSTRACT

The present invention relates to a polycrystalline thin film deposit acting as a substrate material composed of grains of a cubic structure in which the intergranular misorientation, defined as the orientation difference between the a-axes (or b-axes) of the neighboring grains, is less than 30 degrees. Such a substrate base is produced by depositing a target material on a base material by sputtering while irradiating the substrate base with ion beams at an oblique angle to the base. The preferred range of the oblique angle is between 40 to 60 degrees. Examples are presented of application of such textured polycrystalline substrate base for the production of superconducting oxide thin layer of outstanding superconducting properties.

27 Claims, 21 Drawing Sheets

INCIDENT BEAM VOLTAGE 300V
INCIDENT BEAM CURRENT 70 μA/cm$^2$

INCIDENT BEAM VOLTAGE 300V
INCIDENT BEAM CURRENT 40 μA/cm$^2$

INCIDENT BEAM VOLTAGE 300V
INCIDENT BEAM CURRENT 20 μA/cm²

INCIDENT BEAM VOLTAGE 300V
INCIDENT BEAM CURRENT 10 μA/cm²

1

METHOD OF MAKING POLYCRYSTALLINE THIN FILM AND SUPERCONDUCTING OXIDE BODY

This is a division of application Ser. No. 08/155,647 filed on Nov. 22, 1993, which is a continuation of application Ser. No. 07/956,077 filed on Oct. 2, 1992 both of them now abandoned.

FIELD OF THE INVENTION

The present invention is related to a method of producing highly oriented polycrystalline thin films suitable as a substrate for forming a superconducting oxide body on the polycrystalline thin film, and examples of superconducting oxide thin films produced by the method are presented.

BACKGROUND OF THE INVENTION

The oxide superconducting materials discovered in recent years are excellent superconductors having the critical temperatures above the liquid nitrogen temperature; however, for such materials to become useful for practical applications, many problems with the existing materials must be overcome. One such problem is that their critical current density (referred to as Jc hereinbelow) is low.

The problem of low Jc is largely caused by the anisotropic electrical properties of the existing oxide superconductors, and it is known that the electrical current can pass through the material easily in the a- and b-axes direction, but not in the c-axis direction. This would indicate that to form such materials on a substrate material and utilize it as a superconductor, it is necessary to form oxide superconductors of a highly oriented structure, whose crystals axes are oriented such that the a- and b-axes are oriented in the direction of high current demand while the c-axis is oriented in the direction of low current demand.

There have been a number of attempts to align the axis of the crystals deposited on the surface of such substrate bases as plates and metal tapes. One such method involves depositing thin films on single crystal substrate bases having a similar crystal structure as the oxide superconductors, such as MgO and $SrTiO_3$, with the use of such thin film forming techniques as sputtering.

The use of single crystal materials such as MgO and $SrTiO_3$ as a substrate and sputtering crystal thereon enables the deposited crystals to duplicate the highly oriented single crystal structure of the substrate material. Oxide superconductors thus produced have exhibited excellent Jc of several hundred thousand to several million amperes/cm² ($A/cm^2$).

However, to utilize oxide superconductors as electrical conductors, it is necessary to form the crystal on the surface of an extending object such as a tape substrate. However, when a superconductor crystal is formed on the surface of a metal tape, for example, the deposited crystal layer can hardly be expected to have an oriented structure because such tapes are polycrystalline and also possess a crystal structure different from the deposited oxide superconductor. Further, thermal processing accompanying the film forming process promotes inter-diffusion of elements between the oxide superconductor and the substrate material, leading to degradation of the oxide material, and the resulting deterioration in the superconducting properties.

The conventional approach, therefore, has been to utilize an intermediate layer on top of the metal tape substrate, such as MgO and $SrTiO_3$, for example, and to deposit the oxide material on top of the intermediate layer. However, oxide superconducting films, formed by sputtering on top of such an intermediate layer, exhibited considerably lower Jc values (for example, several thousand to several tens of thousands $A/cm^2$) compared with those formed on top of a single crystal layer. The reason for this result is thought to be as follows.

FIG. 9 is a schematic illustration of the cross sectional microstructure of an oxide superconductor having an oxide superconducting layer 3, formed on top of an intermediate sputtered layer 2 formed on the top surface of a substrate base 1, such as a metal tape. In FIG. 19, the oxide superconducting layer 3 is polycrystalline, and the numerous crystals 4 are randomly oriented. Examined in more detail, it is found that although the c-axis of the various crystals are aligned perpendicular to the base surface, the a- and b-axes are randomly oriented.

It is thought that the degradation in the superconducting properties occurs as a result of the degradation in order parameter of superconductivity at the grain boundaries between the randomly oriented crystals, thereby resulting in a loss of superconducting properties, in particular, to a degradation in Jc.

Further, a reason for the polycrystalline deposit to have a random orientation of a- and b-axes is that the intermediate layer 2 is polycrystalline with randomly oriented a- and b-axes, so that a superconducting oxide layer 3 grown on top of the randomly oriented intermediate layer 2 is also affected by the crystal arrangement in the layer 2.

SUMMARY OF THE PRESENT INVENTION

The present invention is directed to solving such existing problems discussed above. An objective is to present a polycrystalline thin film having a superior arrangement of crystals to the conventional materials so that not only the c-axis is aligned perpendicular to the surface of the thin film, but there is an in-plane alignment of the a- and b-axes.

Another objective of the present invention is to present a method for making a polycrystalline thin film having not only the c-axis aligned perpendicular to the surface of the thin film, but the a- and b-axes are also aligned.

Yet another objective of the present invention is to present a superconducting body having a layer made of an oxide layer having not only the c-axis aligned perpendicular to the film surface, but a biaxial alignment of the a- and b-axes, and a method of making such a superconducting body.

One of the features of the present invention is that, in a polycrystalline thin film, bound at the grain boundaries, of a cubic crystal structure formed by the invented method of depositing polycrystals on a substrate base, the range of preferred orientation of the a- or b-axis in the grains, defined as an intergrannular misorientation, is not more than 30 degrees. An example of such a polycrystalline film in this invention is stabilized zirconia. Such zirconia may be stabilized with MgO or $Y_2O_3$. The substrate base can be either silver, silver alloys, gold, gold alloys, stainless steels, copper, copper alloys, nickel alloys, Hastelloy C (Ni-17Mo-5W-14Cr), Hastelloy A, Hastelloy B, glasses or ceramic materials. The c-axes of the grains are preferably aligned perpendicular to the surface of the polycrystalline film, and either the a- or the b-axes are aligned in a common direction, with intergrannular misorientation of not more than 30 degrees.

The present invention also presents a method of making a polycrystalline thin film on a substrate base by sputtering a desired composition material on the polycrystalline substrate material and during the sputtering step, the surface of the polycrystalline substrate base is irradiated with ion beams at an oblique incidence angle to the polycrystalline substrate base. It is preferable that the oblique incidence angle is not less than 40 degrees and not more than 60 degrees, and the most preferred angle is between about 55 to 60 degrees. The suitable ions are inert gas ions and a mixture of inert gases and at least one ions of constituting elements of the desired composition. The ions can also be a mixture of inert gas ions and gaseous oxygen ions. These ions are produced from an ion gun operated at a large ion beam current and a low ion beam voltage. The ion beams are radiated at a high ionic current and a low speed.

The present invention also presents a superconducting oxide thin layer comprising of a plurality of polycrystalline grains formed on top of a polycrystalline thin film formed on a substrate base, wherein the polycrystalline thin film comprises essentially a plurality of grains of a cubic crystal structure defined by a-, b- and c-axes, and wherein the intergrannular misorientation of the a-axes of the plurality of grains of a cubic structure is not more than 30 degrees. The polycrystalline thin layer is a stabilized zirconia thin layer.

The present invention also presents a method of making a superconducting thin layer on a polycrystalline thin film acting as a substrate base having a plurality of grains of a cubic crystal structure defined by a-, b- and c-axes, comprising the steps of: depositing a polycrystalline thin film on the substrate base to make a polycrystalline thin film substrate; depositing a superconducting oxide thin layer on the polycrystalline film substrate; and during the depositing step the surface of the polycrystalline deposit being formed on the substrate base is irradiated with ion beams at an oblique incidence angle to the deposit surface. The intergrannular misorientation of the plurality of grains is not more than 30 degrees, and wherein the superconducting oxide thin layer is formed on the plurality of grains having intergrannular misorientation of not more than 30 degrees.

The polycrystalline thin films produced by the method of the present invention exhibit X-ray diffraction peaks from the (311) planes at 2θ=58.7 degrees for every 90 degrees rotation of the thin film. These peaks correspond to (011) planes of the polycrystal grains in the film, and demonstrate that the grains have a preferred orientation. Explained in other ways, such results demonstrate that the a-axes themselves are aligned in a certain common direction and the b-axis themselves are aligned in another common direction in the polycrystals. The diffraction peaks are present from 0 to 30 degrees of crystal rotation angle, but they disappear when the rotation angle is 45 degrees, thus demonstrating that the crystal axes of the polycrystals grain are oriented parallel to the plane of the deposited film.

Further, by irradiating ion beams at an oblique incidence angle to the polycrystalline deposit being formed on the substrate base while conducting deposition by sputtering the elements from the target material, the alignment of not only the c-axes but the a- and b-axes are also improved. Thus, even when the thin film is made of polycrystals, the crystal axes alignment in all the three crystal axes is improved, and thin films of improved qualities are obtained. When a superconducting oxide thin layer is formed on top of such a polycrystalline thin film, the oxide thin layer grows in conformity with the substrate base, and the alignment of all the three crystal axes, a-/b- and c-axes, in the oxide layer is also improved.

Further, to produce such polycrystalline thin film of improved preferred orientation, the ion beam irradiation angle is preferably between 55 to 60 degrees, thereby leading also to the formation of an improved preferred orientation of the superconducting oxide thin layer.

Further, when making polycrystalline thin film with ion beam irradiation, it is preferable that the voltage of the ion beam generator is not less than 150 volts and not more than 700 volts, and ion beam current density is not less than 20 $\mu A/cm^2$. When the ion beam voltage is less than 150 volts, ion beam irradiation cannot be carried out satisfactorily, and if the ion beam voltage is more than 700 volts, the velocity of ion beams become too high, and the crystal formation of the thin film is disturbed. Further, when the ion beam current density is less than 20 $\mu A/cm^2$, the radiated amount of ion beams is decreased, and the desired effect of thereof on the crystal alignment cannot be produced.

Next, it is preferable that the surface roughness, $R_{max}$, defined by the peak-to-peak distance, of the substrate base should be not more than 0.15 μm. When the surface of the base material is excessive, the crystal alignment is adversely affected when depositing polycrystalline thin film thereon. Such a requirement for the surface roughness $R_{max}$ of the base material is easily obtainable by the normal manufacturing methods of such base material as metal tapes, such as strip rolling. The smaller the surface roughness $R_{max}$ the more preferable the material, and such typical figures as 0.05 μm obtainable by rolling are quite acceptable.

The thickness of the polycrystalline thin film is preferably not less than 0.1 and not more than 1.0 μm. If the thickness is less than 0.1 μm, during the deposition process with ion beam irradiation, the crystals start out as a randomly oriented film. As the deposition process is continued, the crystals begin to align themselves gradually under the influence of the ion beam irradiation, and after some thickness is built up, the crystal alignment begins to take shape. Therefore, for the crystals to be aligned well in the final polycrystalline thin film, it is preferable to have the thickness of a minimum of 0.1 μm. On the other hand, if the film thickness is too large, such as over 1.0 μm, there is a danger that internal stresses may accumulate. Such internal stresses are sources of defect formation in the polycrystalline thin film, and are not desirable.

The surface roughness, $R_{max}$, requirement presented above is partly related to the film thickness. Considering the degree of surface protrusions caused by surface roughness, there is a danger of interdiffusion of metallic substrate material with the superconducting oxide layer deposited on the polycrystalline thin film, when the polycrystalline film is not completely covering the surface of the metallic base material. If the metal protrusions are allowed to contact the oxide material, thereby causing interdiffusion and contamination of the oxide layer during heat treatment processing steps, the final superconducting oxide layer would not perform to the expectation.

PREFERRED EMBODIMENTS OF THE INVENTION

The embodiments of the invention are discussed with reference to the figures.

Figure 1:
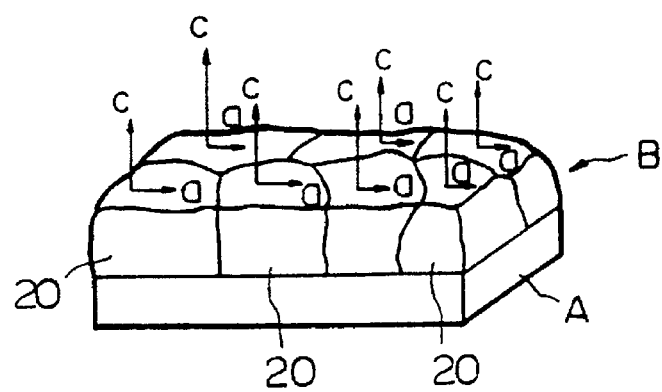
FIG. 1 is a schematic illustration of the microstructure of a first embodiment of the invention.

FIG. 1 illustrates a microstructure of a polycrystalline thin film B formed on a strip type substrate base A.

The form of the substrate base A can be any of such extending forms as a strip, a wire or a tape. The substrate material is a metallic material such as silver, platinum, stainless steel, and copper and nickel metals (for example Hastelloy) including their alloys, or non-metals such as various glasses and ceramics.

The polycrystalline thin film B in FIG. 1 is composed of fine crystals 20, of a cubic crystal system, with grain boundaries R therebetween. The c-axes of a plurality of crystals 20 are perpendicular to the surface of the substrate base A, and all the a-axes are oriented roughly in one direction while all the b-axes are oriented roughly in another common direction orthognal to the a-axis direction, lying in a plane parallel to the surface of the substrate base.

Figure 2:
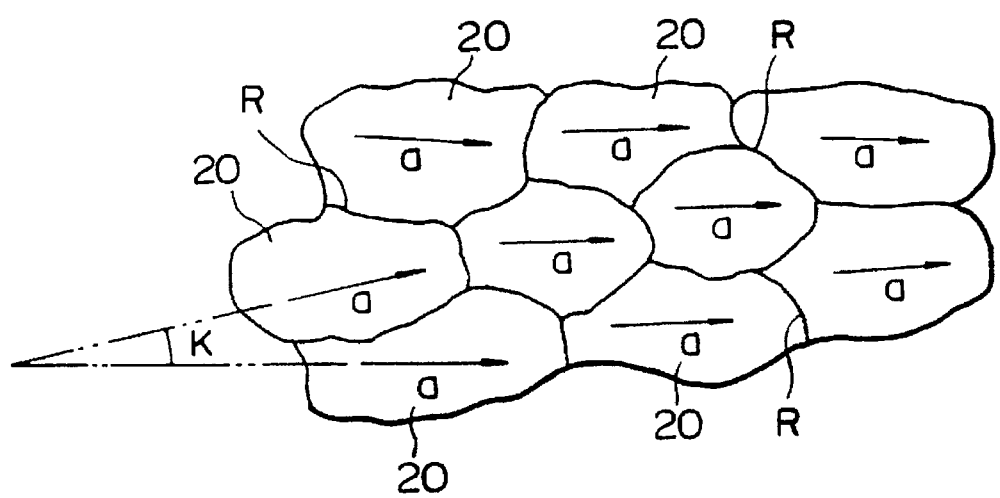
FIG. 2 is an enlarged plan view of the crystal orientations shown in FIG. 1.

The degree of misorientation of the a-axes (or the b-axes), shown by an intergrannular orientation angle K in FIG. 2, is maintained within 30 degrees.

Next, an embodiment of the apparatus for making polycrystalline thin film B will be presented.

Figure 3:
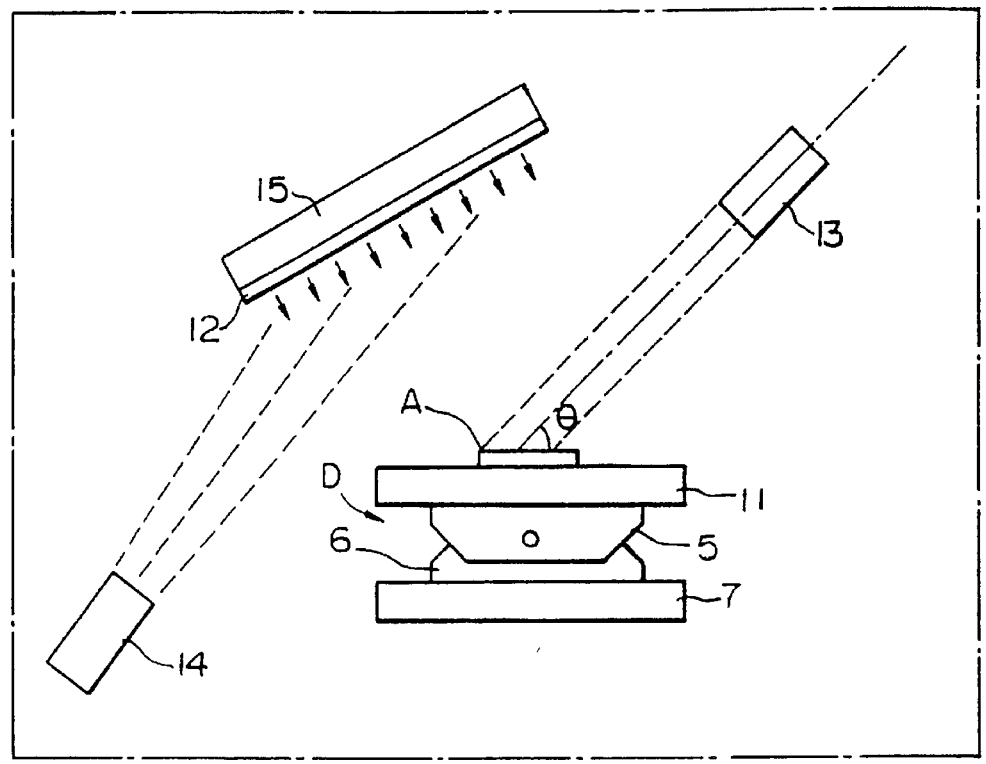
FIG. 3 is an example of the apparatus for forming a polycrystalline thin film on a substrate material.

The apparatus shown in FIG. 3 is equipped with an ion gun to provide ion beam assisted sputter deposition. The apparatus is composed primarily of a substrate base holder 11 for holding the substrate base A, a target plate 12 which is disposed obliquely in the upper opposing direction of the base holder 11, an ion gun 13 which is disposed in the upper side direction opposing the base holder 11 and spaced away from the target plate 12, and a sputtering beam generation device 14 (shortened to sputtering device 14) which is disposed away from the target plate 12 and aimed at the bottom surface thereof. The target plate 12 is held in a target holder 15.

The apparatus is housed in a deposition vessel which maintains a vacuum environment in and around the region of the base A. The deposition vessel is connected to gas cylinders and other means for controlling the ambient atmosphere, so as to generate an ambient atmosphere of reduced gas pressure containing an inert gas or oxygen.

When a strip shaped metallic tape (such as Hastelloy or stainless steel tape) is used as the base A, it is preferable to arrange a tape sending roll and a pick-up roll within the vacuum system so that the tape base can be automatically fed to the base holder 11, and the processed tape base can be rolled up so that polycrystalline thin film can be produced continuously.

Inside the deposition vessel, a heater is provided so as to enable adjustment of the temperature of the substrate base A placed on the base holder 11 to a desired temperature. Further, at the base portion of the base holder 11 is disposed an angle adjusting device D, which is composed primarily of an upper support plate 5, a lower support plate 6 which is pinned to the upper plate 5 and a base plate 7 which supports the lower support plate 6. The pinned joint between the upper support plate 5 and the lower support plate 6 is freely rotatable around the pin joint to enable adjustment of the tilt of the base holder 11. In this embodiment, the angle adjusting device D was provided on the base holder 11, but this device can equally effectively be placed on the ion gun 13 to enable adjustment of the tilt of the ion gun 13 to adjust the angle of incidence of the ion beam. The angle adjustment device need not be limited to the design shown in this embodiment, and other designs which enable the adjustment of the ion beam incident angle can also be used.

The target plate 12 is used to form the desired composition of the polycrystalline thin film, and should be made of a material having the same as or similar to the composition of the desired thin film. In practice, the target plate 12 is frequently made of such materials as MgO or $Y_2O_3$ stabilized zirconia (YSZ), MgO or $SrTiO_3$, but the target plate can be made of any composition consistent with the composition of the desired polycrystalline thin film.

The vapor source for the ion gun 13 is disposed inside the deposition vessel with lead-in electrode outlets nearby. A portion of the atoms or molecules generated by the vapor source is ionized, and the ion gun 13 bombards the substrate base A with ionized particles whose paths are controlled by the electrical field generated by the electrodes. The ionizing methods include direct arc discharge, high frequency excitation, hot filament, and clustered ion beam. The hot filament method utilizes a tungsten filament which is electrically heated in a high vacuum to generate thermal electrons which collide with the vapors and ionize the atoms. The clustered ion beam method involves ionizing of clustered atoms exiting from a crucible containing the raw material and effusing into the vacuum environment, with thermally generated electrons to ionize the atoms and to irradiate the substrate base A with the ionized atoms.

Figure 4:
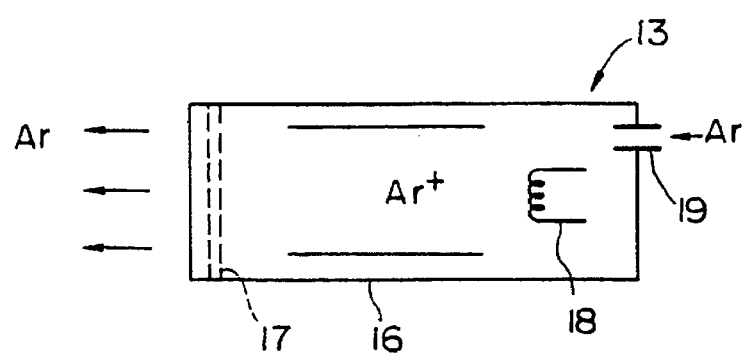
FIG. 4 is a cross sectional view of an example of the ion beam device in the thin film forming apparatus shown in FIG. 3.

In this embodiment, an ion gun 13 of the design shown in FIG. 4 was used. This ion gun 13 comprises a cylindrical container 16 within which is disposed lead-in electrodes 17, a filament 18 and lead-in piping 19 for admitting gases such as Ar. The ion beam is generated in parallel from the tip of the container 16.

The ion gun 13 is disposed, as shown in FIG. 4, so that the axis S of the gun 13 is inclined at an angle θ to the top surface of the substrate base A (film forming plane). This angle is preferably between 40 to 60 degrees. The most preferred angle is not less than 55 and not more than 60 degrees. Therefore, the ion gun 13 is positioned such that it can radiate ion beams to the surface of the substrate base A at an angle θ. The ion beams can be composed of any ions or a mixture thereof, such as argon and oxygen ions, rare gas ions such as He+, Ne+, Ar+, Xe+, Kr+, or a mixture of rare gas ions and oxygen ions.

The sputtering device 14 has a similar construction to the ion gun 13, and is designed to bombard the target plate 12 and eject the atoms of the target plate 12 therefrom. Since the objective is to obtain the constituent atoms of the target plate 12, it is also acceptable to impress an electrical voltage by such means as a high frequency coil and other energy imparting devices, in place of the sputtering device 14.

Next, a case of forming polycrystalline thin film of YSZ (yttrium stabilized zirconia) on the substrate base A will be described.

To form polycrystalline YSZ on the substrate base A, a target plate of YSZ composition is used, and the angle adjusting device D is adjusted so that the ion beam from the ion gun 13 will be incident on the surface of the base holder 11 at an angle of about 40–60 degrees. Next, the container which houses the base A is evacuated until a reduced pressure is obtained inside the container. The ion gun 13 and the sputtering device 14 are readied for operation.

When the ions from the sputtering device 14 are made to bombard the target plate 12, and as the constituent particles of the target plate 12 are ejected out and fly to the surface of the substrate base A, a mixture of argon ions and oxygen ions is also directed to the substrate base A from the ion gun 13. The most preferred angle of incidence θ of the ion beam is about 55–60 degrees, but any angle between 40 to 60 would be acceptable. The angle of incidence of 90 degrees is not preferred, because even though the c-axes of the polycrystalline thin film become perpendicular to the surface of the substrate base A, the growth surface of the film becomes (111). When the angle θ is as low as 30 degrees, even the c-axis alignment becomes unattainable. When the ion beam is directed at an angle within the above specified range, (100) planes of the cubic structure will be the main growth planes of the thin film surface.

It thus becomes possible to align the a- and b-axes (biaxial alignment) of the YSZ thin film by sputtering while irradiating the growing film with ion beam at some specific angle. The exact reason for the phenomenon is not known, but it may be that the ion beams activate and align the YSZ molecules preferentially in certain crystallographic direction while the molecules are being sputtered onto the substrate base A.

FIG. 2 shows one such embodiment in which polycrystalline thin film B was formed on a substrate base A. The thin film B consists of fine grains 20 of a cubic crystal structure being bound together via grain boundaries R. The c-axes of the grains 20 are aligned perpendicular to the film surface while the a- and b-axes of the grains 20 are aligned in respective common directions.

The a-axes (or b-axes) misorientation is within 30 degrees of each other (the intergrannular orientation angle K shown in FIG. 2).

As described above, according to the present invention, by irradiating the thin film being grown by sputtering with ion beams at a specific preferred angle, it becomes possible to control the orientation of not only the c-axis but the a- and b-axis of the film being sputtered. Therefore, with the method of the present invention, it is possible to produce thin films having all of the crystal axes, a-, b- and c-axes, oriented in desired directions, even when the thin film produced is polycrystalline.

In particular, by setting the angle of irradiation of ion beams at 40-60 degrees, and by utilizing ion beams composed of a mixture of argon and oxygen ions, it becomes possible to obtain a thin film having a high degree of alignment of all the crystal axes.

Figure 5:
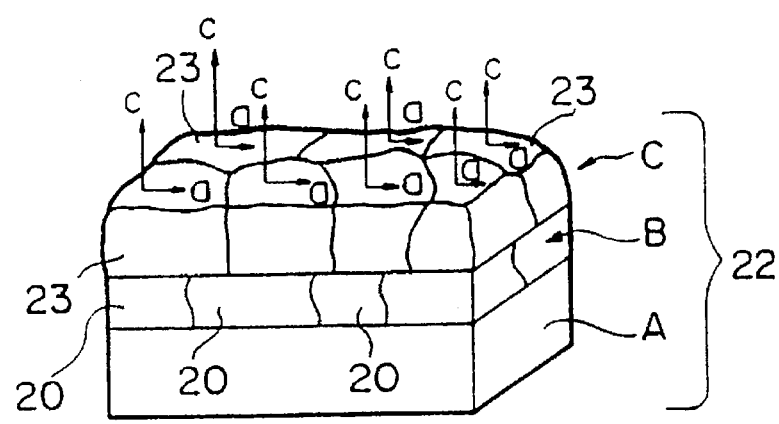
FIG. 5 is a schematic illustration of an example of the microstructure of an oxide thin layer superconductor of the present invention.

FIG. 5 illustrates an embodiment of an oxide superconducting body 22, consisting of a substrate base A of a plate shape, polycrystalline thin film B formed on the substrate base A and an oxide superconducting layer C formed on the polycrystalline thin film B acting as a film substrate B. The substrate base A and the polycrystalline film B are the same as those presented in the previous embodiment.

The oxide superconducting layer C is deposited on the top surface of the polycrystalline film B, and their c-axes are aligned perpendicular to the film B, and the a- and b-axes are, as explained in the previous embodiment, aligned on a plane parallel to the surface of the substrate base A. The oxide superconducting materials constituting the oxide superconducting layer C can be any oxide superconducting materials having a high critical temperature typified by such substances as: $Y_1Ba_2Cu_3O_X$, $Y_2Ba_4Cu_8O_X$, $Y_3Ba_3Cu_6O_X$, or the like composition; $(Bi,Pb)_2Ca_2Sr_2Cu_3O_X$ or $(Bi,Pb)_2Ca_2Sr_3Cu_4O_X$ or the like composition; $Tl_2Ba_2Ca_2Cu_3O_X$, $Tl_1Ba_2Ca_2Cu_3O_X$, $Tl_1Ba_2Ca_3Cu_4O_X$ or the like composition.

As illustrated in FIG. 5, the oxide superconducting layer C consists of fine grains 23 of a cubic crystal structure being bound together via grain boundaries. The c-axes of the grains 23 are aligned perpendicular to the film surface while the a- and b-axes of the grains 23 are aligned in respective common directions.

Figure 6:
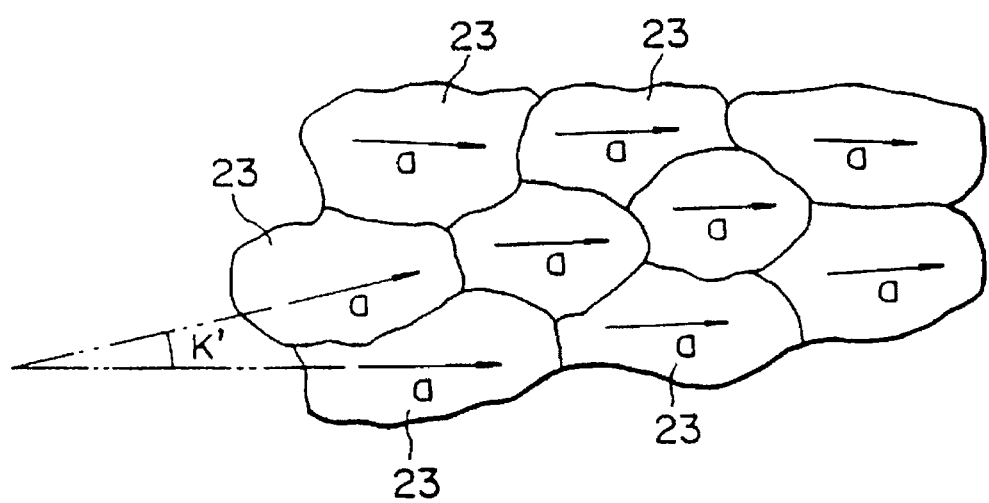
FIG. 6 is an enlarged plan view of the crystal orientations shown in FIG. 5.

The a-axes (or b-axes) misorientation is within 30 degrees of each other (the intergrannular orientation angle K shown in FIG. 6).

The superconducting oxide layers produced according to the method of the present invention demonstrate superior quantum coupling as well as a lesser tendency for degradation in grain boundary superconductivity, and thus excel in the ability to pass current in the planar direction, thereby producing superconducting materials having a superior Jc.

Next, an apparatus for producing oxide superconducting layers will be described.

Figure 7:
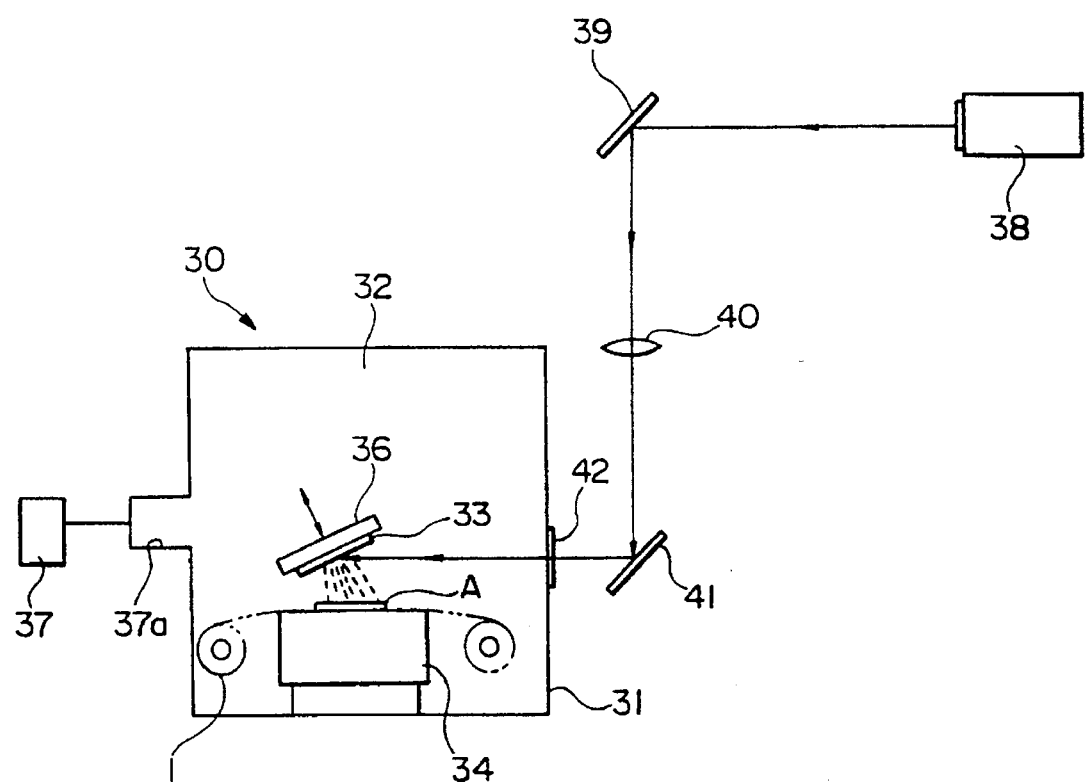
FIG. 7 is a laser deposition device for making a superconducting layer on top of a polycrystalline thin film acting as a substrate.

FIG. 7 illustrates an embodiment of the apparatus for producing an oxide superconducting layer C in accordance with the present invention. FIG. 7 is a laser vapor deposition apparatus. The laser deposition apparatus 30 consists of a deposition vessel 31 within which is disposed a deposition chamber 32 which houses a substrate base A and a target plate 33. At the base of the deposition chamber 32 is disposed a base support 34 which supports the base A horizontally. The target plate 33 which is supported obliquely on a support holder 36 is disposed at an angle in an upper side location.

The pressure in the deposition vessel 31 can be reduced to a suitable level by means of an evacuation pipe 37a connecting to an evacuation device 37.

The target plate 33 is in a plate form and can be made of such materials as: a material which has the same as or similar composition to the desired oxide superconducting layer C; a sintered composite material which contains readily vaporizable oxide materials; or an oxide superconducting material. The base support 34 has an internal heater which heats the substrate base A to a desired temperature.

On the side of the deposition vessel 31, there are provided a laser generation device 38, a first reflector mirror 39, a focussing lens 40 and a second reflector mirror 41, so as to be able to direct the laser beam generated by the laser generation device 38, and focus it on the surface of a target plate 33 through a window 42 provided on the sidewall of the deposition vessel 31. There is no particular restriction to the laser generation device so long as it is capable of driving the desired species from the target plate 33: some examples are a YAG laser, $CO_2$ laser and excimer lasers.

Next, with reference to FIG. 7, the procedure for depositing oxide superconducting layer C, on polycrystalline film substrate B formed on the substrate base A, using the above deposition apparatus will be described.

The process begins with a sample substrate base A which has been processed in the apparatus shown in FIG. 3 to pre-deposit a polycrystalline thin film B thereon. This sample is placed on top of the base support 34 of the laser deposition apparatus 30 shown in FIG. 7, and the pressure within the deposition chamber 32 is reduced by means of the vacuum pump 37. As necessary, the chamber atmosphere can be made oxidizing by introducing oxidizing gases such as oxygen into the deposition chamber 32. The substrate base A is heated to a desired temperature by means of the internal heater provided on the base support 34.

Next, the laser beam from the generation device 38 is focussed onto the surface of the target plate 33. By this process, the constituting elements of the target plate 33 are either ejected out or vaporized and are deposited on the surface of the substrate base A, thus forming a polycrystalline oxide superconducting layer C. In this case, because the crystal axes a-, b- and c-axes of the grains on the polycrystalline thin film B are already aligned in preferred directions; the growth of the grains in the oxide superconducting layer C occurs in a corresponding alignment with the a-, b- and c-axes of the substrate film B, and thereby providing a superior oxide superconducting layer C having preferred grain alignment.

In the polycrystalline oxide superconducting layer C formed on top of the polycrystalline film B, each of the grains 23 has its c-axis (the poor current flow direction) aligned in one direction, as shown in FIG. 5, and either the a-axes or b-axes of each grain 23 are aligned along the longitudinal direction of the substrate base A.

As explained above, the oxide superconducting body of the present invention is formed on top of the pre-aligned substrate polycrystalline base. The X-ray diffraction tests, which will be described later, show cyclic peaks at a 90 degrees interval, and it is concluded that the polycrystalline substrate material exhibits an excellent preferred orientation of grains, and that the oxide layer is formed on such a material exhibiting a preferred orientation. Further, because the polycrystalline material displays the characteristics that the a-axes or b-axes themselves are oriented within 30 degrees of a direction, the overall deposit exhibits the same preferred orientation of the grains. The resulting oxide superconducting layer exhibits superior quantum coupling as well as a lesser tendency for degradation in grain boundary superconductivity, and excels in the ability to pass current in the planar direction, and exhibits a high Jc.

Further, it is possible to form oxide superconducting layer composed of grains whose a-, b- and c-axes are aligned in preferred directions, by irradiating the polycrystalline deposit being formed on the substrate base with an ion beam at an angle to the surface of the substrate base during the growth of the oxide superconducting layer by sputtering from the target plate. Thus, the apparatus of the present invention is able to produce oxide layer of excellent grain orientation having a-, b- and c-axes alignment, even though the oxide layer is composed of polycrystals.

Figure 8:
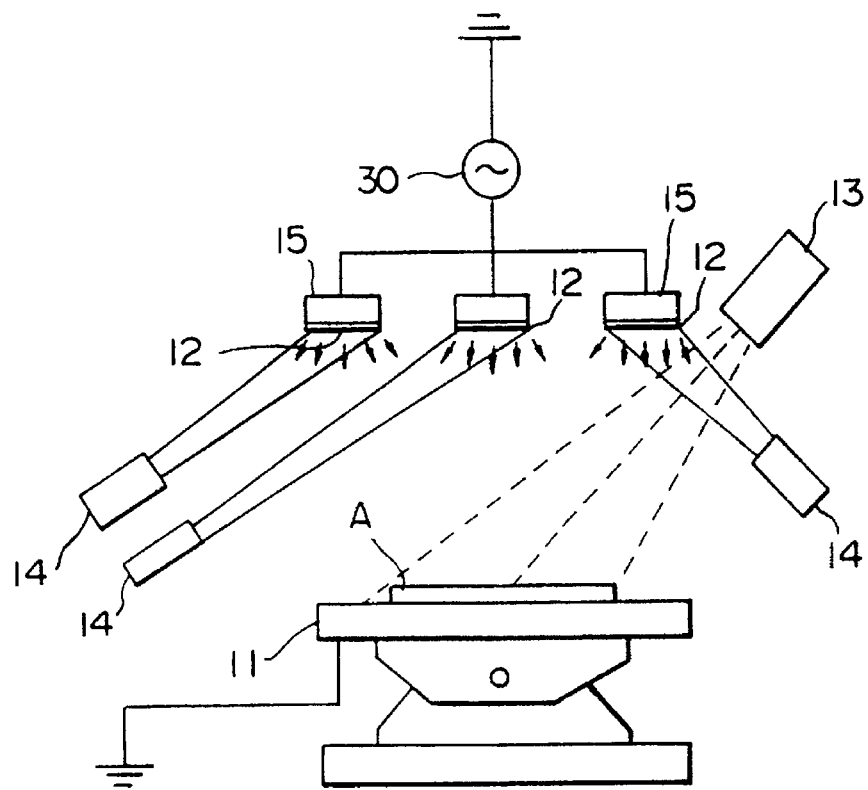
FIG. 8 shows another embodiment of the deposition apparatus of the present invention.
Figure 9:
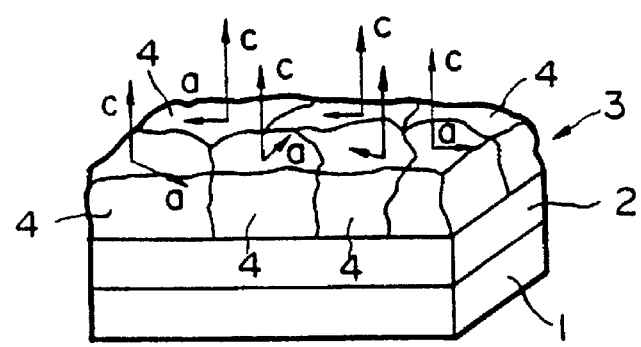
FIG. 9 is a schematic illustration of the microstructure of produced by the conventional deposition methods.

FIG. 8 illustrates another embodiment of the deposition apparatus. The components which provide the same function as those shown in FIG. 3 are given the same numeric designations, and their explanations are omitted. The differences between the embodiments shown in FIGS. 3 and 8 are that: there are three target plates 12; there are three sputtering beam generation devices 14; and high frequency source 29 is connected to both the substrate base A and to the target plate 12.

Using the above type of arrangement, three different material species can be ejected from the respective three target plates 12, thus enabling to produce more complex polycrystalline films on the substrate base A. The high frequency source 30 can be used to sputter materials from the target plate 12.

The thin film produced by this apparatus also demonstrates excellent alignment of grains as in the case of the apparatus shown in FIG. 3.

EXAMPLES

The following examples demonstrate the details of making samples in accordance with the methods and apparatus of the present invention.

The material used for the substrate base A was Hastelloy C-276 of 10 mm width, 0.5 mm thickness, and 100 mm length. The target material was YSZ (yttrium stabilized zirconia). The apparatus shown in FIG. 3 was operated under the following conditions: the container was evacuated to $3.0 \times 10^{-4}$ torr; the sputtering voltage was set to 1,000 volts; sputtering current was set to 100 mA; the ion beam incidence angle was set to either 45 or 90 degrees; the assist voltage of ion gun was set to one of 300, 500 or 700 volts; and the ion gun current was set to between 15–50 mA. Samples of polycrystalline YSZ oxide layer thus produced exhibited oxide layer thickness of 0.3 μm.

X-ray diffraction studies for the range of angles, θ-2θ, were carried out on these samples using the radiation from a copper target (CuKα line).

Figure 10:
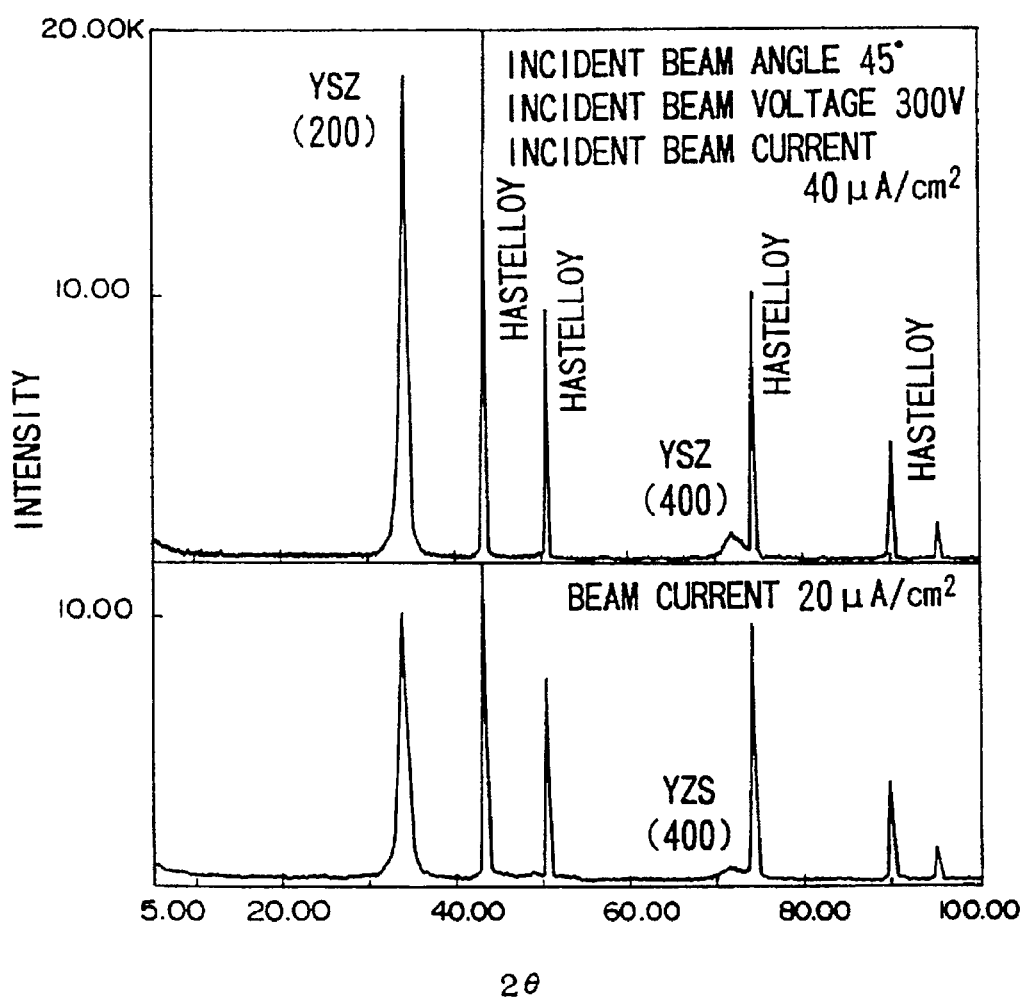
FIG. 10 shows an X-ray spectrograph of a polycrystalline thin film made with the beam voltage of 300 volts.
Figure 11:
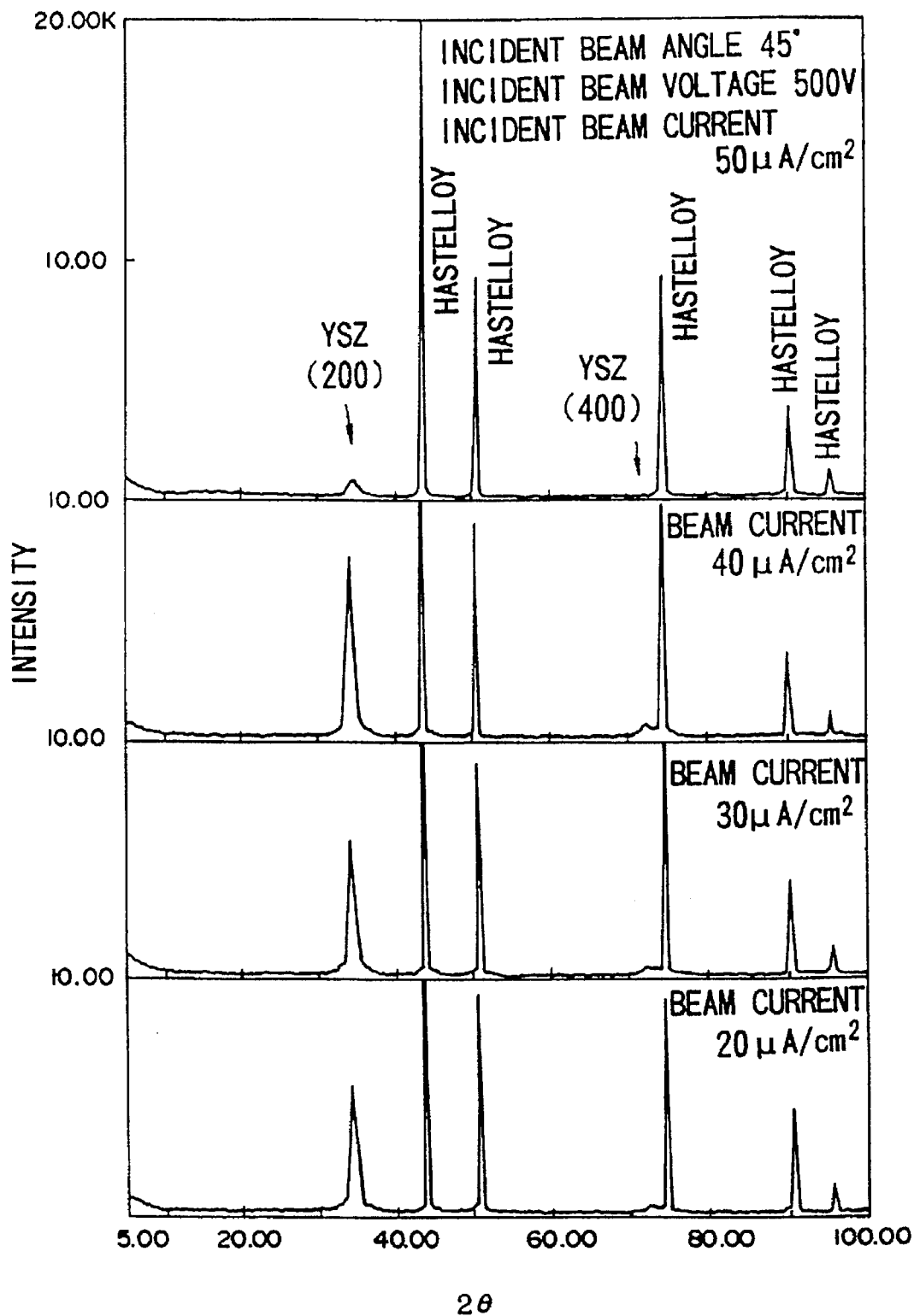
FIG. 11 shows an X-ray spectrograph of another polycrystalline thin film made with the beam voltage of 500 volts.
Figure 12:
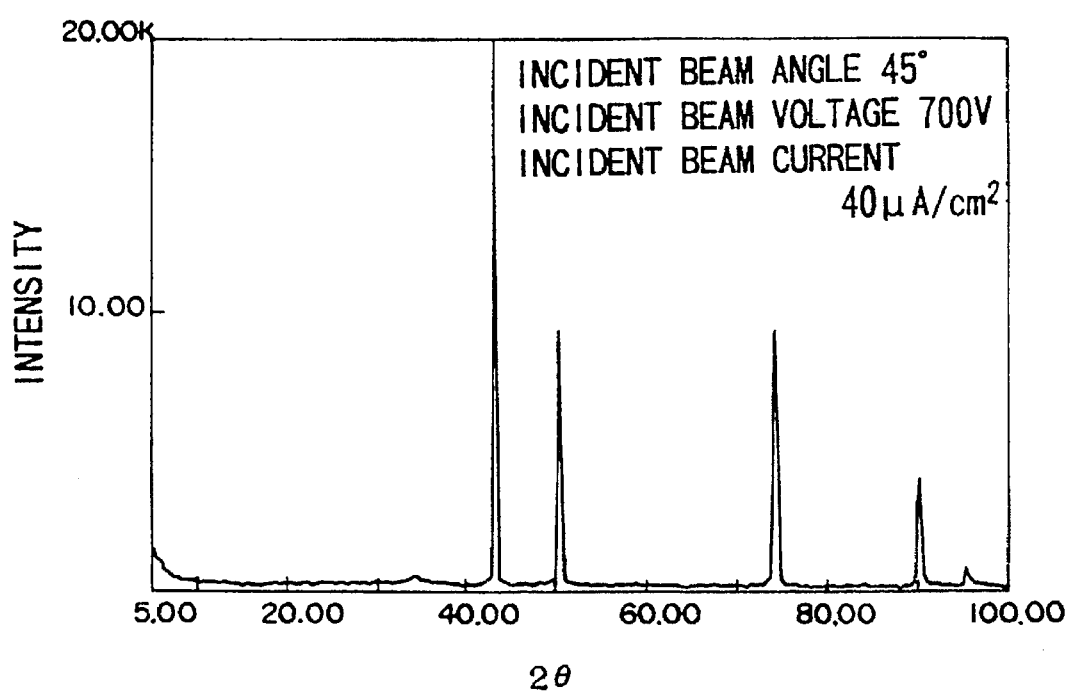
FIG. 12 shows an X-ray spectrograph of another polycrystalline thin film made with the beam voltage of 700 volts.

FIGS. 10 to 12 shown the intensities of diffraction from the samples produced with the ion beam incidence angle of 45 degrees, and varying the ion beam voltage and current as indicated on each of the figures.

The results indicate that the peaks are observed from either the (200) or (400) planes of YSZ oxide layer, leading to a conclusion that the (100) planes of the polycrystalline thin film are aligned parallel to the substrate base surface, and that the c-axis of the YSZ polycrystalline oxide layer is aligned perpendicular to the substrate base surface. By comparing the peak height of the various graphs shown in FIGS. 10 to 12, it can be observed that a better alignment of the c-axis of the polycrystalline thin film is obtained at high beam current and low beam voltage, i.e. high ionic current at low speeds.

Figure 13:
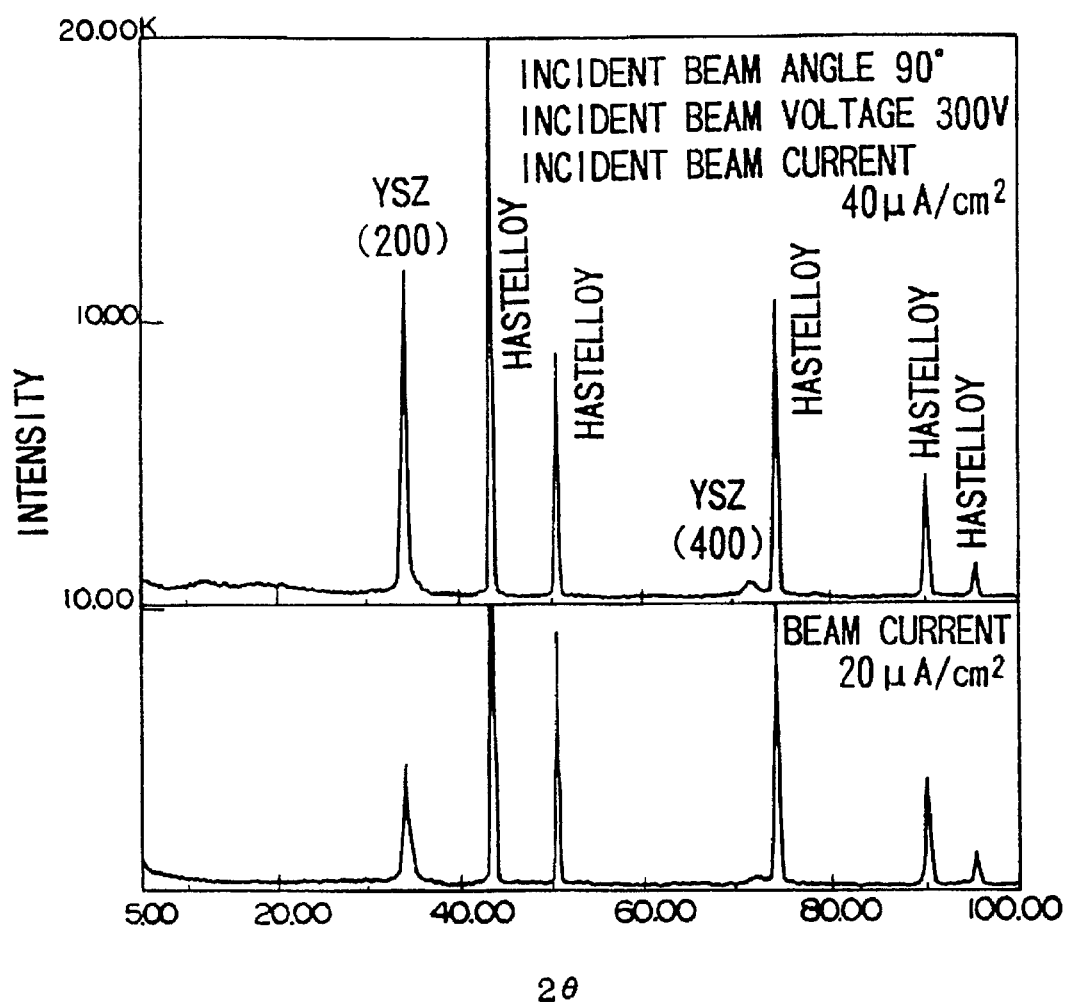
FIG. 13 shows an X-ray spectrograph of a comparative sample of a polycrystalline thin film made with the beam voltage of 300 volts.
Figure 14:
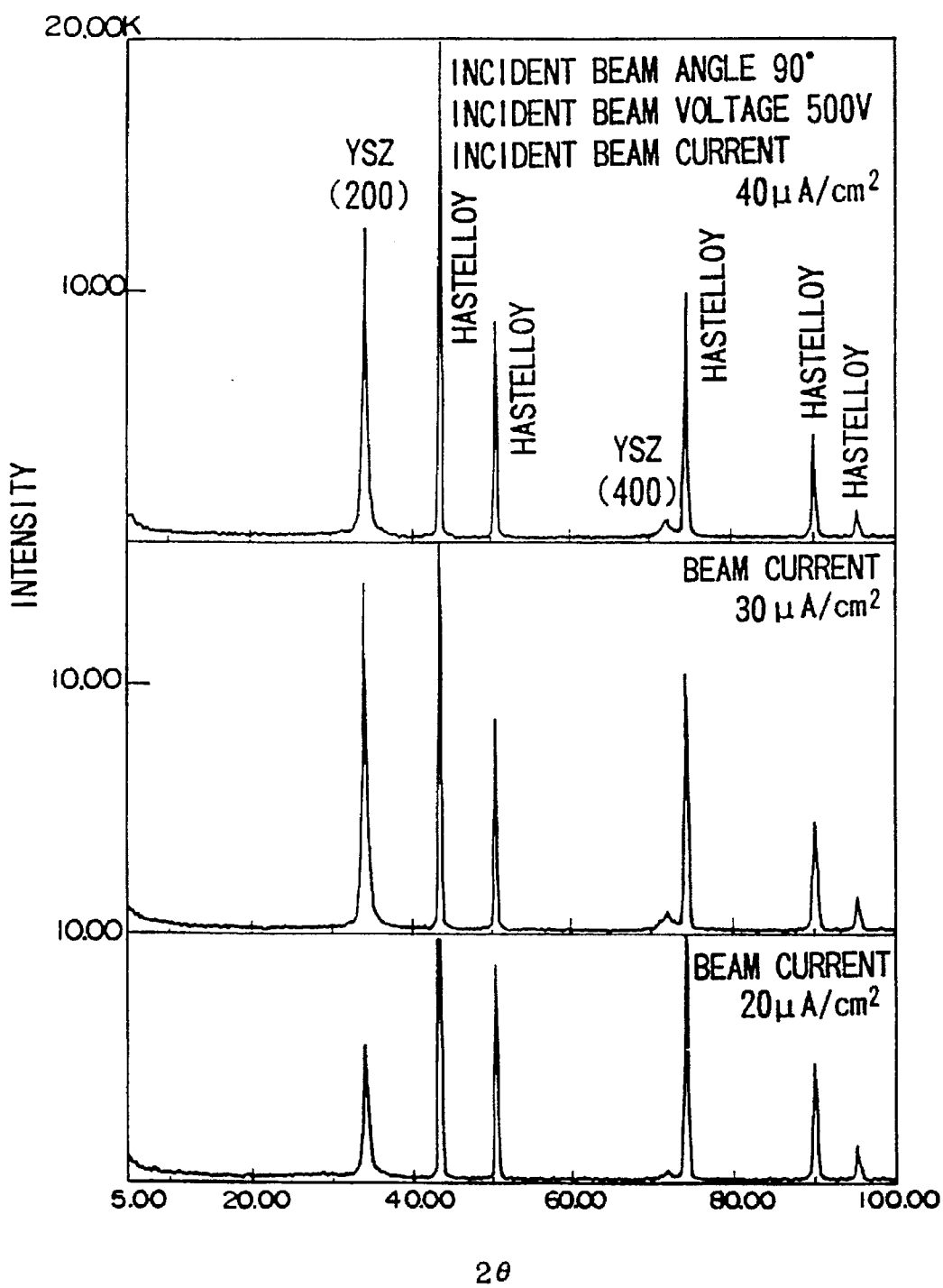
FIG. 14 shows an X-ray spectrograph of a comparative sample of a polycrystalline thin film made with the beam voltage of 500 volts.
Figure 15:
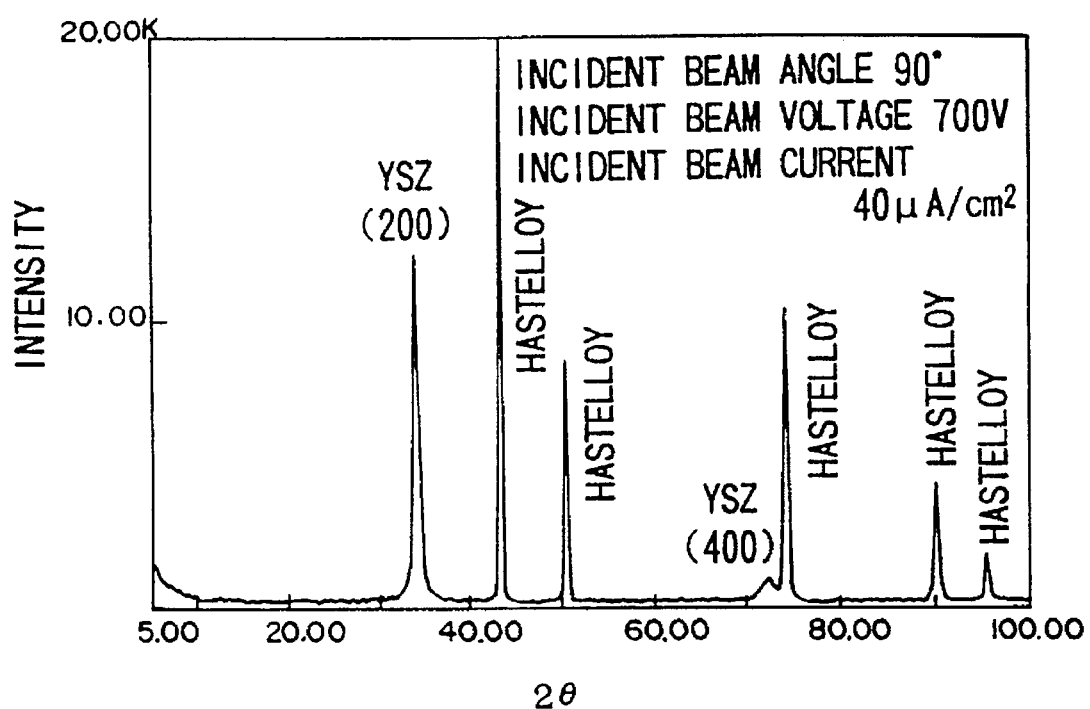
FIG. 15 shows an X-ray spectrograph of a comparative sample of a polycrystalline thin film made with the beam voltage of 700 volts.

FIGS. 13 to 15 illustrate the cases of the ion beam is aimed at a 90 degree incidence angle. The results indicate that even at the angle of 90 degrees, sufficient degree of alignment of the c-axis could be obtained.

Next, studies were carried out to determine whether the a- and b-axes were also aligned in the above samples which shows c-axis alignment.

Figure 16:
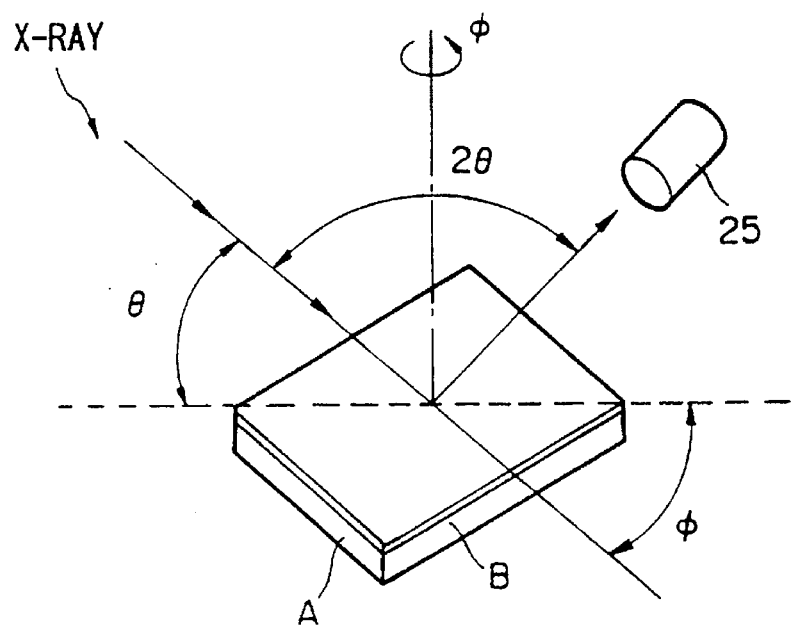
FIG. 16 is a schematic of a device for checking the degree of alignment of a- and b-axes of polycrystalline thin films.

To perform this determination, it is necessary to arrange the sample as shown in FIG. 16 so that the X-rays radiate the sample of YSZ polycrystalline layer at an angle θ, and positioning the X-ray counter 25 at 2θ or (58.7 degrees), within a vertical plane inclusive of the X-rays, and rotating the sample on a horizontal plane, which is orthognal to the vertical plane above, through an angle φ. In other words, the biaxial alignment was checked by rotating the sample through a rotation angle φ and measuring the diffraction intensity. The results are shown in FIGS. 17 and 18.

Figure 17:
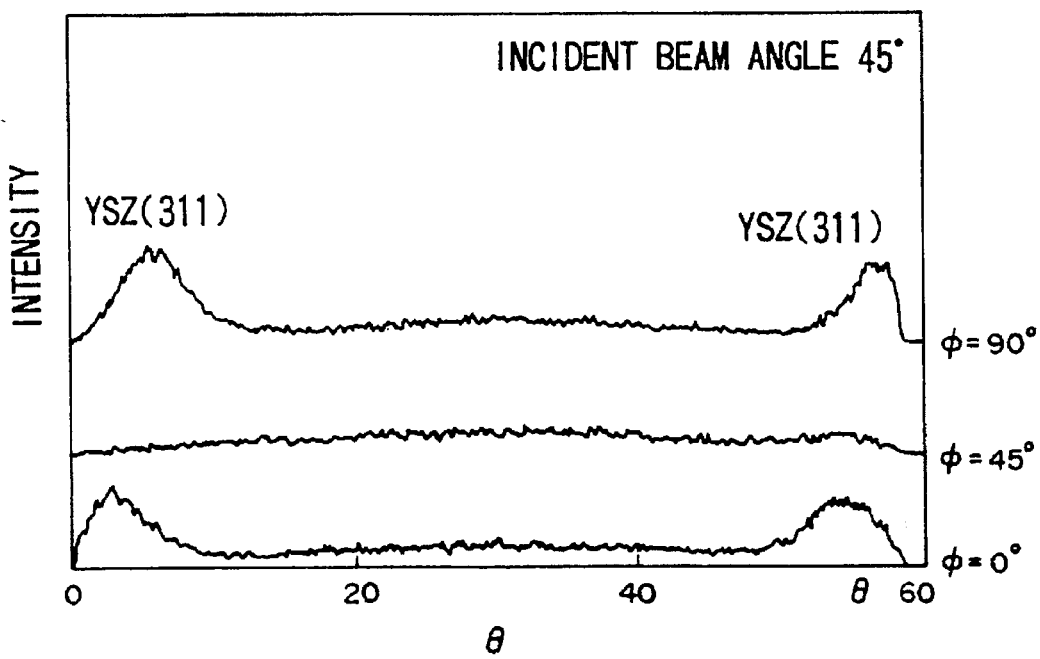
FIG. 17 is an X-ray diffractograph from (311) planes for an incidence beam at 45 degrees.

As shown in FIG. 17, when the samples are made with the ion beam incidence angle θ at 45 degrees, the diffraction peaks are not observed when the rotation angle φ is 45 degrees. The peeks appear at the rotation angles of 0 and 90 degrees, i.e. for every 90 degrees rotation, the (311) peaks appear. These correspond to diffraction lines from (011) plane of YSZ, indicating clearly that the a-axes themselves are aligned and likewise the b-axes themselves are aligned within the polycrystalline YSZ layer.

Figure 18:
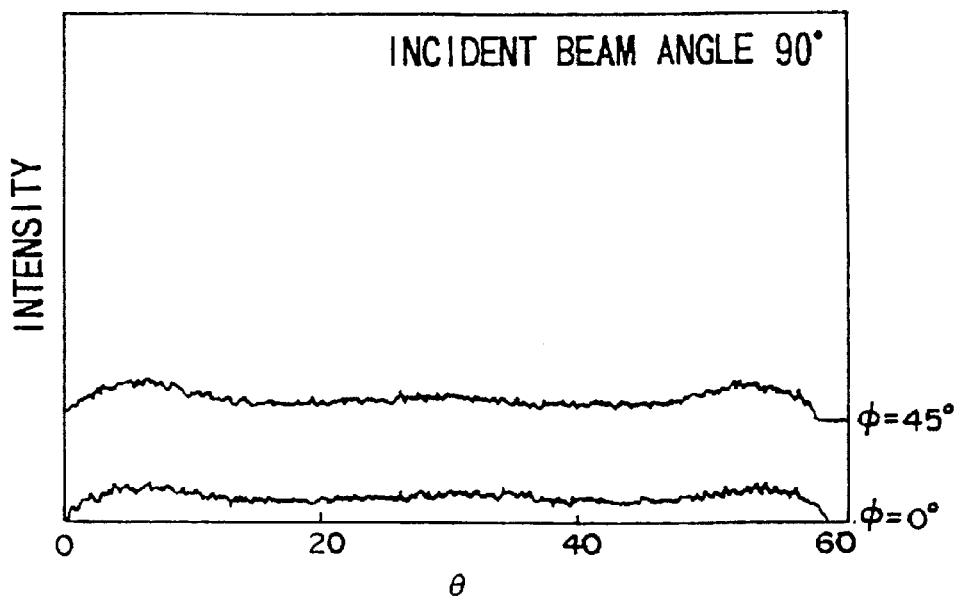
FIG. 18 is an X-ray diffractograph from (311) planes for an incidence beam at 90 degrees.

In contrast to the above observation, when the YSZ layers were produced with the ion beam incidence angle θ at 90 degrees, shown in FIG. 18, no particular peaks are observed at any rotation angle, indicating that the a- and b-axes are randomly oriented within the polycrystalline oxide layer.

From the above sets of observations, it was concluded that the thin film samples produced in the deposition apparatus of the present invention exhibited not only the alignment of c-axis but also a biaxial alignment of a- and b-axes. It was thus demonstrated that polycrystalline YSZ thin films, exhibiting an excellent crystal axis alignment can be produced with the method and the apparatus of the present invention.

Figure 19:
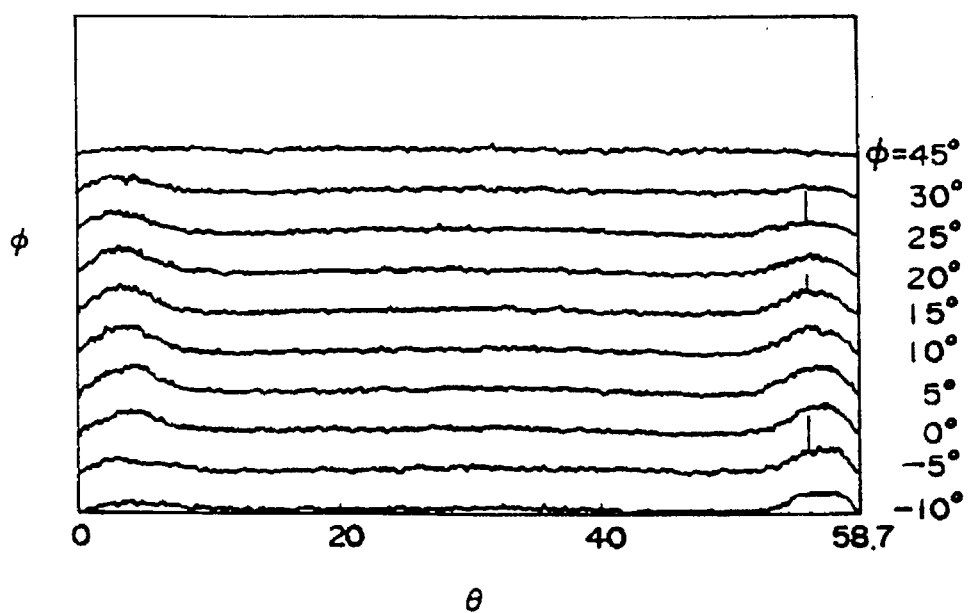
FIG. 19 is an X-ray diffractograph for every 5 degree radial angle rotation obtained from a sample of polycrystalline thin film of the present invention.
Figure 20:
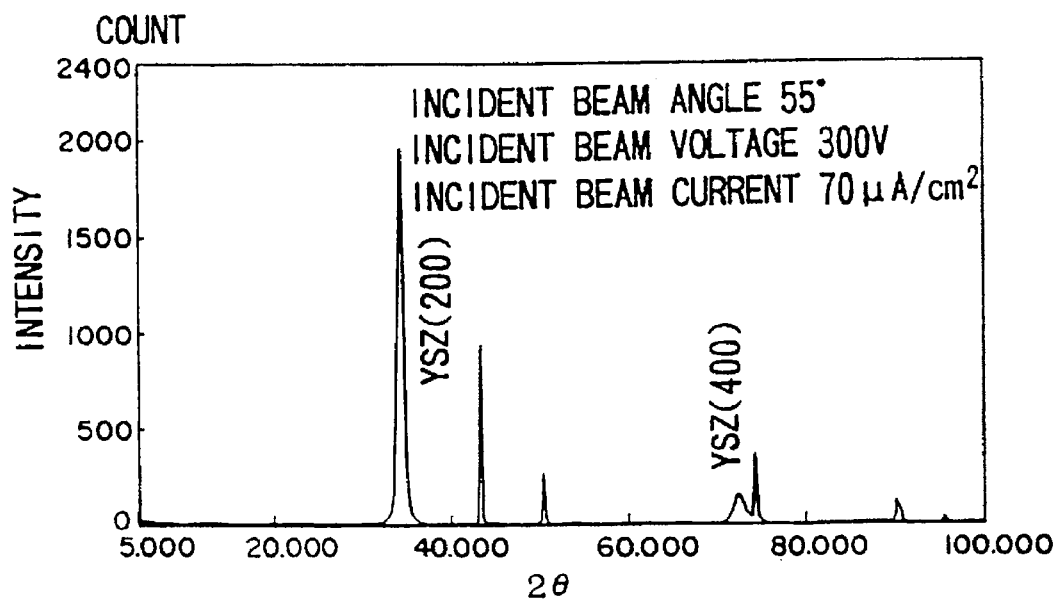
FIG. 20 is an X-ray spectrograph of a polycrystalline thin film produced under the conditions of beam angle 55 degrees; a beam voltage of 300 V; and beam current density of 70 $\mu A/cm^2$.
Figure 21:
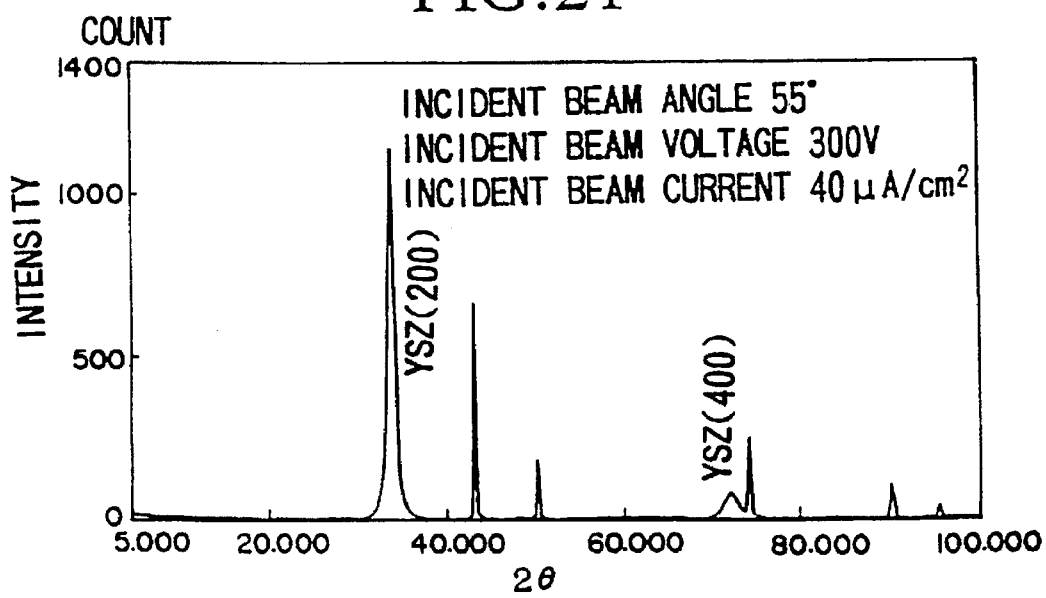
FIG. 21 is an X-ray spectrograph of a polycrystalline thin film produced under the conditions of beam angle 55 degrees; a beam voltage of 300 V; and beam current density of 40 $\mu A/cm^2$.
Figure 22:
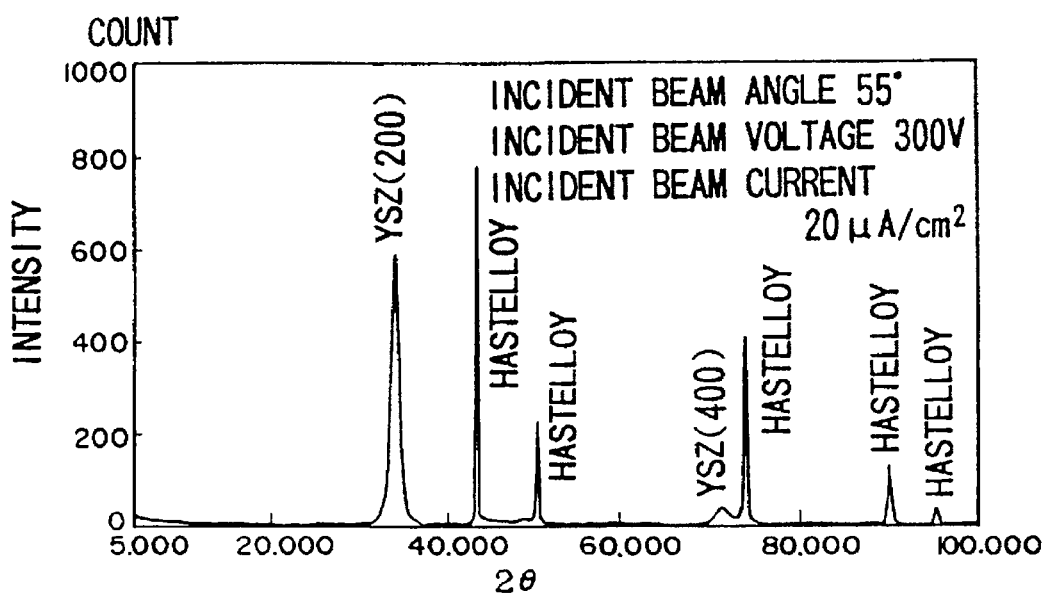
FIG. 22 is an X-ray spectrograph of a polycrystalline thin film produced under the conditions of beam angle 55 degrees; a beam voltage of 300 V; and beam current density of 20 $\mu A/cm^2$.
Figure 23:
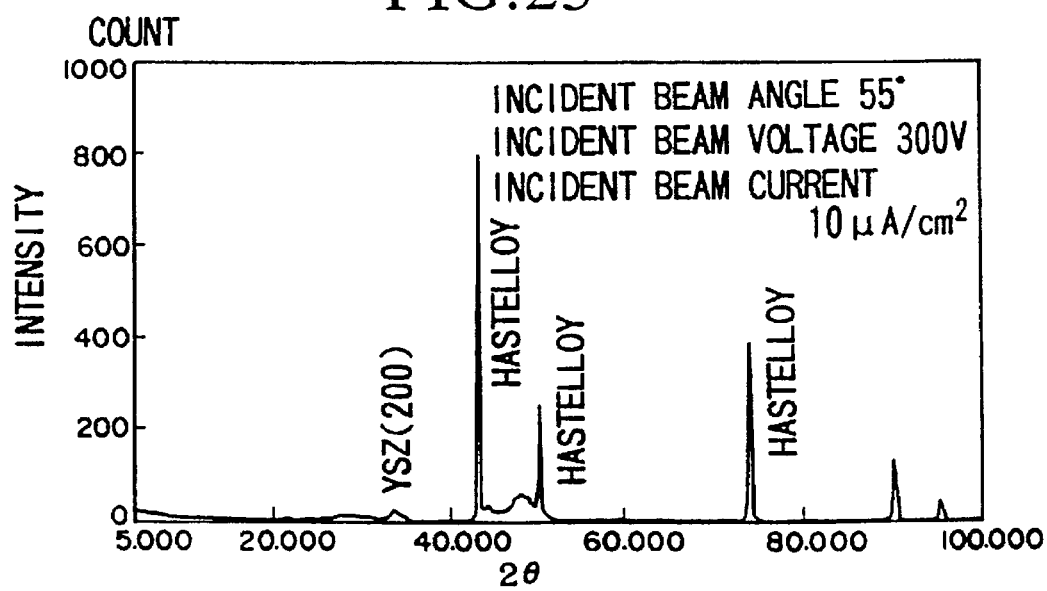
FIG. 23 is an X-ray spectrograph of a polycrystalline thin film produced under the conditions of beam angle 55 degrees; a beam voltage of 300 V; and beam current density of 10 $\mu A/cm^2$.
Figure 24:
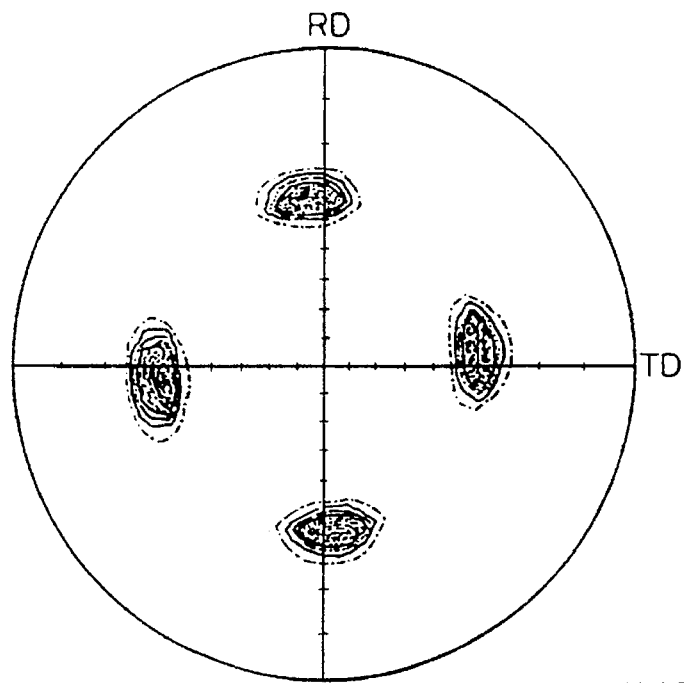
FIG. 24 is a pole figure of a polycrystalline thin film produced under the conditions of beam angle 55 degrees; a beam voltage of 300 V; and beam current density of 70 $\mu A/cm^2$.
Figure 25:
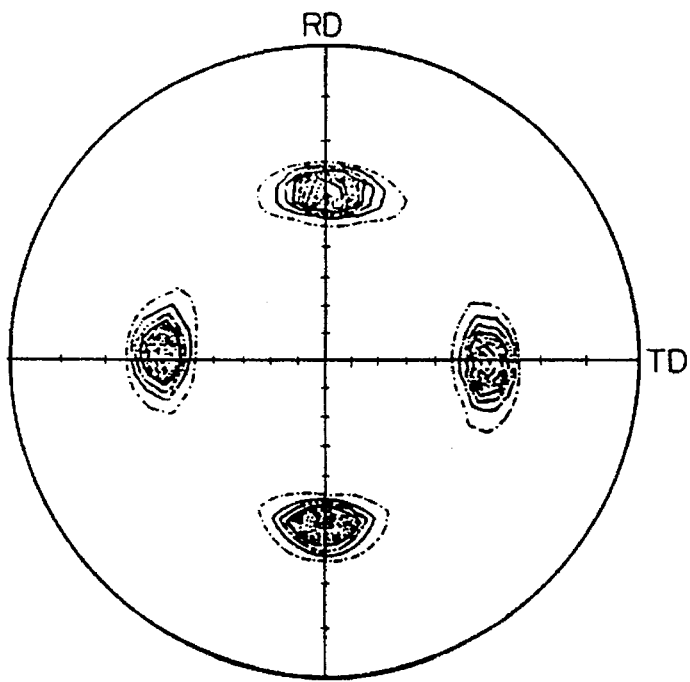
FIG. 25 is a pole figure of a polycrystalline thin film produced under the conditions of beam angle 55 degrees; a beam voltage of 300 V; and beam current density of 40 $\mu A/cm^2$.
Figure 26:
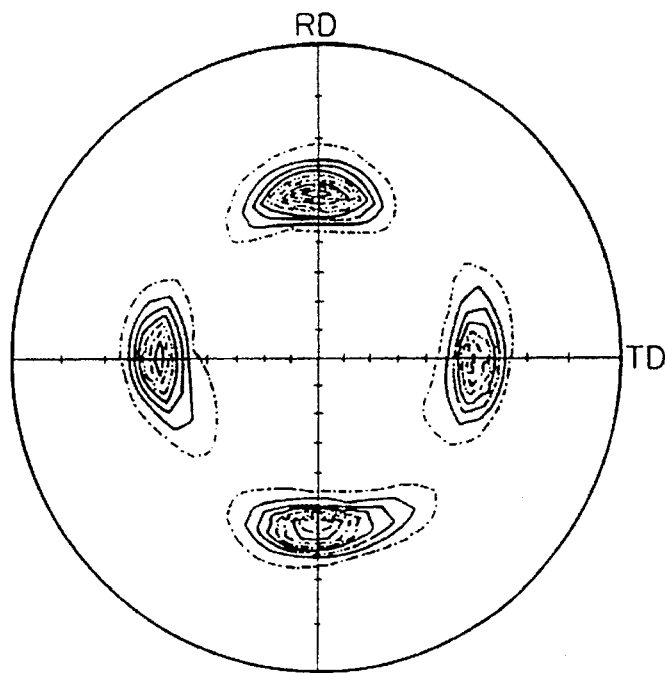
FIG. 26 is a pole figure of a polycrystalline thin film produced under the conditions of beam angle 55 degrees; a beam voltage of 300 V; and beam current density of 20 $\mu A/cm^2$.
Figure 27:
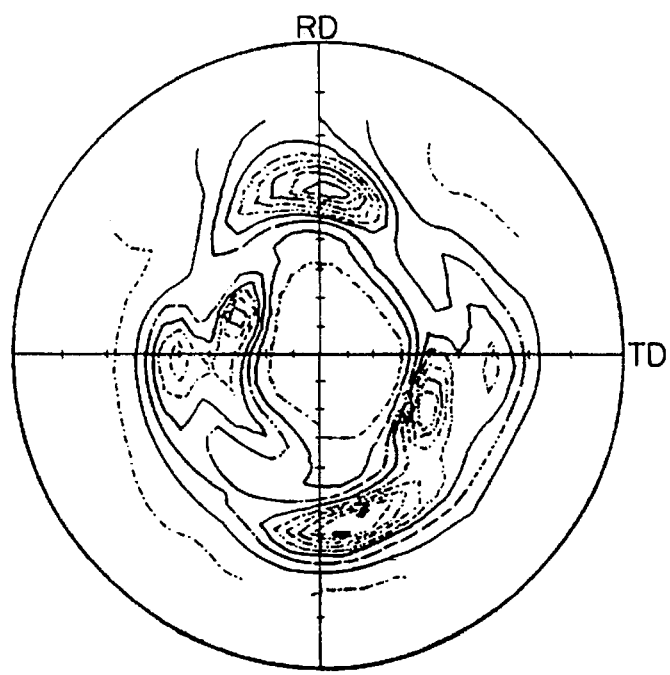
FIG. 27 is a pole figure of a polycrystalline thin film produced under the conditions of beam angle 55 degrees; a beam voltage of 300 V; and beam current density of 10 $\mu A/cm^2$.
Figure 28:
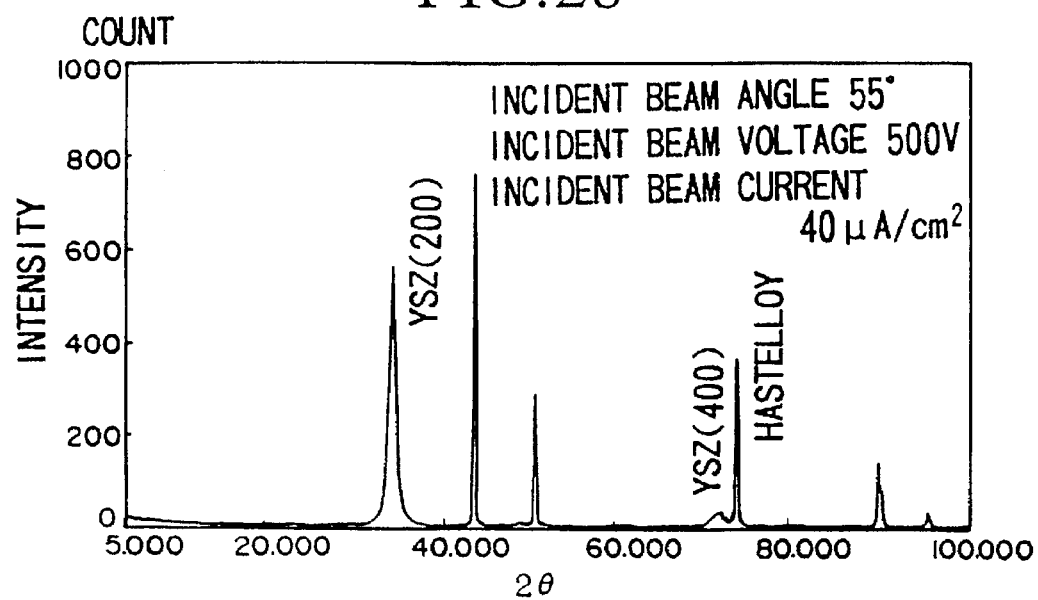
FIG. 28 is an X-ray spectrograph of a polycrystalline thin film produced under the conditions of beam angle 55 degrees; a beam voltage of 500 V; and beam current density of 40 $\mu A/cm^2$.
Figure 29:
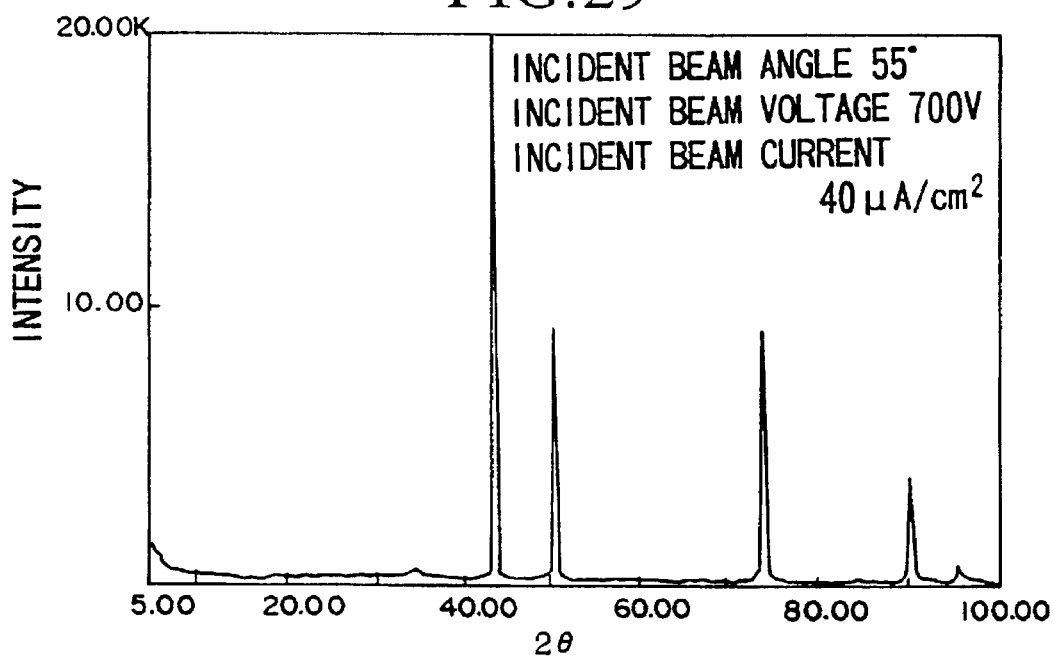
FIG. 29 is a pole figure of a polycrystalline thin film produced under the conditions of beam angle 55 degrees; a beam voltage of 300 V; and beam current density of 40 $\mu A/cm^2$.
Figure 30:
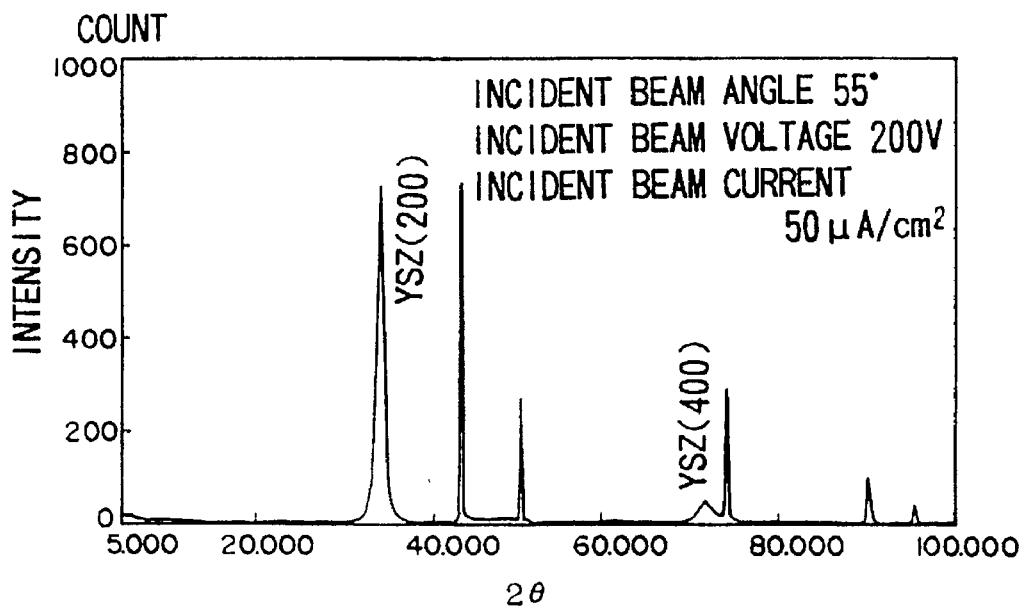
FIG. 30 is an X-ray spectrograph of a polycrystalline thin film produced under the conditions of beam angle 55 degrees; a beam voltage of 200 V; and beam current density of 50 $\mu A/cm^2$.
Figure 31:
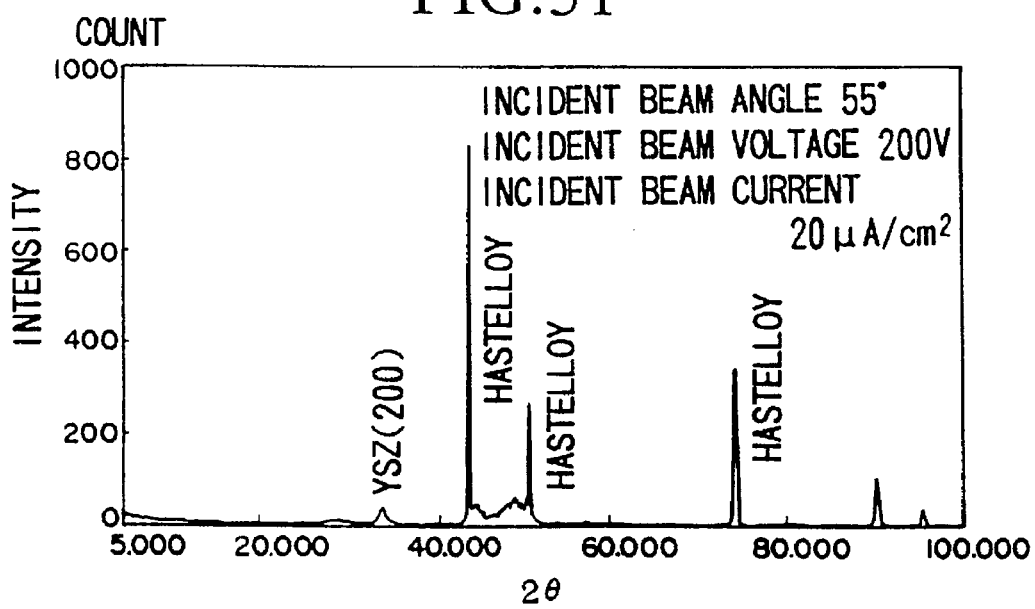
FIG. 31 is an X-ray spectrograph of a polycrystalline thin film produced under the conditions of beam angle 55 degrees; a beam voltage of 200 V; and beam current density of 20 $\mu A/cm^2$.
Figure 32:
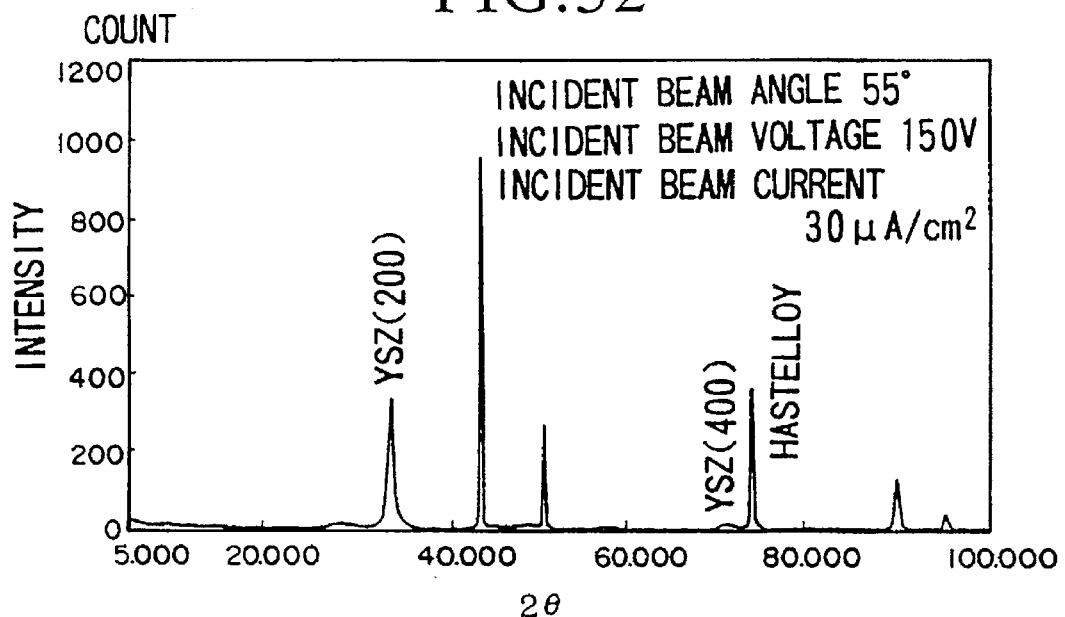
FIG. 32 is an X-ray spectrograph of a polycrystalline thin film produced under the conditions of beam angle 55 degrees; a beam voltage of 150 V; and beam current density of 30 $\mu A/cm^2$.

FIG. 19 shows the results of X-ray diffraction studies carried out using polycrystalline materials shown in FIG. 15, to investigate the intergrannular texture of the grains in the polycrystalline film. The diffraction studies were carried out using the set-up shown in FIG. 16, and φ was varied every 5 degrees from −10 to 45 degrees.

The results shown in FIG. 19 indicate clearly that the diffraction peaks are observed within φ=30 degrees but they disappear beyond φ=45 degrees, leading to a conclusion that the grain misorientations are mostly within 30 degrees and that the material has an excellent preferred texture.

Next, superconducting oxide layer was formed, using the laser deposition apparatus Shown in FIG. 7, on top of the polycrystalline thin film described above. The target plate used was composed of a superconducting material having a composition represented by $Y_{0.7}Ba_{1.7}Cu_{3.0}O_{7-x}$. The deposition chamber was evacuated to $10^{-6}$ torr, and the laser deposition process was carried out at room temperature. The wavelength of the vaporizing ArF laser beam was 193 nm. After the deposition process was completed, the deposited substrate base was heat treated in an oxidizing atmosphere for 60 minutes at 400° C. The product thus produced was 0.5 mm width and 100 mm length.

The oxide layer product was cooled to 90 K, and their superconductive properties were measured. It was determined that the product was excellent as indicated by the figures of critical current density at $10^5$ A/cm$^2$.

Next, using the deposition conditions approximately the same as those shown in FIGS. 10 to 12, polycrystalline thin films were produced with the ion beam current fixed at 300 volts, the ion beam current density was varied from 70, 40, 20 to 10 μA/cm$^2$. The X-ray diffraction and X-ray pole figures for these crystals are shown in FIGS. 20 to 27.

These results show that above the ion beam current density of above 20 μA/cm$^2$, the crystals begin to show excellent alignment.

Further, polycrystalline thin films were produced with the use of a similar procedure as presented above, and with the use of ion beam irradiation conditions as noted below: beam voltage of 500 V and beam current density of 40 µA/cm$^2$; beam voltage of 300 V and beam current density of 40 µA/cm$^2$; a beam voltage of 200 V and beam current density of 50 µA/cm$^2$; beam voltage of 300 V and beam current density of 20 µA/cm$^2$; beam voltage of 200 V and beam current density of 20 µA/cm$^2$; beam voltage of 150 V and beam current density of 30 µA/cm$^2$. The results of X-ray spectra are shown in FIGS. 28 to 32.

Figure 33:
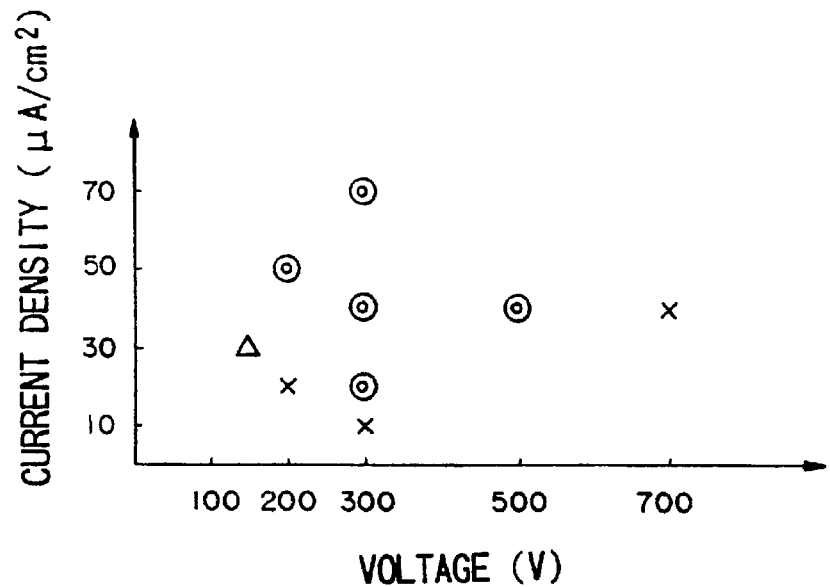
FIG. 33 shows a relationship between the ion beam current density and the ion beam voltage on the crystal alignment.

For the thin films produced, the preferred orientation results were summarized in FIG. 33, by indicating those films showing Good alignment with double circles, those showing some alignment with single circles and those showing no alignment with crosses. The results demonstrate that in forming polycrystalline thin film on a base material, the beam voltage should be not less than 150 volts and not more than 700 volts, and the beam current density should be not less than 20 µA/cm$^2$.

Figure 34:
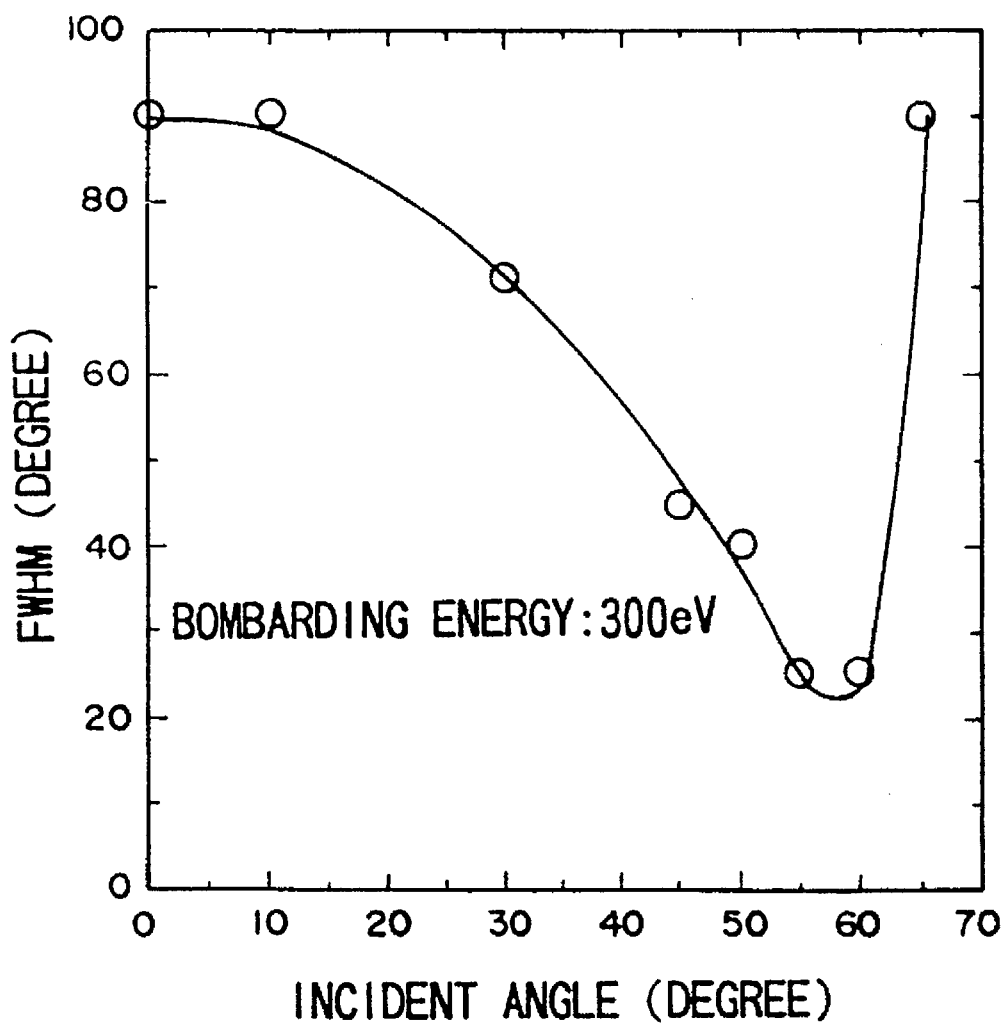
FIG. 34 shows a relationship between the ion beam irradiation angle and the crystal alignment.

FIG. 34 shows a relationship between the beam incident angle and a parameter which reflects the degree of alignment, i.e. the value of the full width half maximum (FWHM) of a diffraction peak, in the polycrystalline film produced under the conditions shown above. These results demonstrate that the beam irradiation angles between 40 to 60 are the preferred angles, and the range of 55 to 60 is the most preferable.

What is claimed is:

1. A method of making a polycrystalline yttrium stabilized zirconia thin film on a metal substrate base, said polycrystalline yttrium stabilized zirconia thin film having a plurality of grains of a cubic crystal structure defined by a-, b- and c-axes, said polycrystalline yttrium stabilized zirconia thin film being formed such that the intergranular misorientation, defined by a range of orientation of said a-axes or said b-axes, is not more than 30 degrees, and said c-axes are perpendicular to a surface of said metal substrate base, comprising the steps of:

(a) placing said metal substrate base on a deposition vessel;

(b) depositing constituting elements of a target material on said metal substrate base so as to form said polycrystalline yttrium stabilized zirconia thin film;

wherein during the step (b), the surface of said polycrystalline yttrium stabilized zirconia thin film being formed on said metal substrate base is irradiated with ion beam at an oblique incidence angle to said polycrystalline thin film, and wherein said oblique incidence angle is selected to be not less than 40 degrees and not more than 60 degrees.

2. A method of making a polycrystalline yttrium stabilized zirconia thin film as claimed in claim 1, wherein said orientation of said a-axes or said b-axes is about 30 degrees.

3. A method of making a polycrystalline yttrium stabilized zirconia thin film as claimed in claim 1, wherein said oblique incidence angle is not less than 55 degrees and not more than 60 degrees.

4. A method of making a polycrystalline yttrium stabilized zirconia thin film as claimed in claim 1, wherein said ion beam is generated by an ion beam generating means operated in a range of an ion beam generating voltage of not less than 200 volts and not more than 500 volts, and at an ion beam current density of not less than 20 µA/cm$^2$ and not more than 70 µA/cm$^2$.

5. A method of making a polycrystalline yttrium stabilized zirconia thin film as claimed in claim 1, wherein said metal substrate base has a surface roughness, defined by $R_{max}$, of not more that 0.15 µm.

6. A method of making a polycrystalline yttrium stabilized zirconia thin film as claimed in claim 5, wherein said metal substrate base has a surface roughness, defined by $R_{max}$, of not more than 0.05 µm.

7. A method of making a polycrystalline yttrium stabilized zirconia thin film as claimed in claim 1, wherein said polycrystalline yttrium stabilized zirconia thin film has a thickness in the range of not less than 0.1 and not more than 1.0 µm.

8. A method of making a polycrystalline yttrium stabilized zirconia thin film as claimed in claim 1, wherein said ion beam is an inert gas ion beam and/or a mixture beam of inert gas ions and at least one type of ion of the constituting elements of said polycrystalline thin film.

9. A method of making a polycrystalline yttrium stabilized zirconia thin film as claimed in claim 1, wherein said ion beam comprises a mixture beam of inert gas ions and gaseous oxygen ions.

10. A method of making a polycrystalline yttrium stabilized zirconia thin film as claimed in claim 1, wherein said metal substrate base is a metallic tape.

11. A method of making a polycrystalline yttrium stabilized zirconia thin film as claimed in claim 1, wherein said substrate base is Hastelloy.

12. A method of making a polycrystalline yttrium stabilized zirconia thin film as claimed in claim 10, wherein said metallic tape is automatically fed to said metal substrate base by a tape sending roll and a pick-up roll within a deposition vessel.

13. A method of making a polycrystalline yttrium stabilized zirconia thin film as claimed in claim 1, wherein said depositing is selected from the group consisting of sputtering, laser deposition and electron beam deposition.

14. A method of making a superconducting oxide thin film on a polycrystalline yttrium stabilized zirconia thin film having a plurality of grains of a cubic crystal structure defined by a-, b- and c-axes on a substrate base, said polycrystalline yttrium stabilized zirconia thin film being formed such that an intergranular misorientation, defined by a range of orientations of said a-axes or said b-axes is not more than 30 degrees, and said c-axes is perpendicular to a surface of said metal substrate base, comprising the steps of:

(a) placing said metal substrate base on a deposition vessel;

(b) depositing constituting elements of a target material on said metal substrate base so as to form said polycrystalline yttrium stabilized zirconia thin film;

(c) depositing the superconducting oxide thin film on said polycrystalline yttrium stabilized zirconia thin film;

wherein during the step (b), the surface of said polycrystalline yttrium stabilized zirconia thin film being formed on said substrate base is irradiated with an ion beam at an oblique incidence angle to said polycrystalline thin film, and wherein said oblique incidence angle is selected to be not less than 40 degrees and not more than 60 degrees.

15. A method of making a superconducting oxide thin film as claimed in claim 14, wherein said orientation of said a-axes or said b-axes is about 30 degrees.

16. A method of making a superconducting oxide thin film as claimed in claim 14, wherein said oblique incidence angle is not less than 55 degrees and not more than 60 degrees.

17. A method of making a superconducting oxide thin film as claimed in claim 14, wherein said ion beam is generated by an ion beam generating means operated in a range of an ion beam generating voltage of not less than 200 volts and not more than 500 volts, and at an ion beam current density of not less than 20 µA/cm$^2$ and not more than 70 µA/cm$^2$.

18. A method of making a superconducting oxide thin film as claimed in claim 14, wherein said metal substrate base has a surface roughness, defined by $R_{max}$, of not more than 0.15 µm.

19. A method of making a superconducting oxide thin film as claimed in claim 18, wherein said metal substrate base has a surface roughness, defined by $R_{max}$, of not more than 0.05 µm.

20. A method of making a superconducting oxide thin film as claimed in claim 14, wherein said polycrystalline yttrium stabilized zirconia thin film has a thickness in a range of not less than 0.1 and not more than 1.0 µm.

21. A method of making a superconducting oxide thin film as claimed in claim 14, wherein said ion beam is an inert gas ion beam and/or a mixture beam of inert gas ions and at least one type of ion of the constituting elements of said polycrystalline thin film.

22. A method of making a superconducting oxide thin film as claimed in claim 14, wherein said ion beam comprises a mixture beam of inert gas ions and gaseous oxygen ions.

23. A method of making a superconducting oxide thin film as claimed in claim 14, wherein said metal substrate base is a metallic tape.

24. A method of making a superconducting oxide thin film as claimed in claim 23, wherein said metallic tape is Hastelloy tape.

25. A method of making a superconducting oxide thin film as claimed in claim 23, wherein said metallic tape is automatically fed to said metal substrate base by a tape sending roll and a pick-up roll within a deposition vessel.

26. A method of making a superconducting oxide thin film as claimed in claim 14, wherein said depositing is selected from the group consisting of sputtering, laser deposition and electron beam deposition.

27. A method of making a superconductive oxide thin film as claimed in claim 14, wherein said superconducting oxide thin film exhibits a critical current density of an order of 10$^5$ A/cm$^2$ at 90K.

* * * * *